United States Patent
Chiang et al.

(10) Patent No.: US 11,195,763 B2
(45) Date of Patent: Dec. 7, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Hung-Li Chiang, Taipei (TW); Chao-Ching Cheng, Hsinchu (TW); Chih-Liang Chen, Hsinchu (TW); Tzu-Chiang Chen, Hsinchu (TW); Ta-Pen Guo, Taipei (TW); Yu-Lin Yang, Hsinchu County (TW); I-Sheng Chen, Taipei (TW); Szu-Wei Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/556,096

(22) Filed: Aug. 29, 2019

(65) Prior Publication Data
US 2019/0393102 A1      Dec. 26, 2019

Related U.S. Application Data

(60) Division of application No. 15/885,359, filed on Jan. 31, 2018, now Pat. No. 10,403,550, which is a
(Continued)

(51) Int. Cl.
*H01L 21/8238* (2006.01)
*H01L 27/092* (2006.01)
(Continued)

(52) U.S. Cl.
CPC ........... *H01L 21/823814* (2013.01); *H01L 21/02532* (2013.01); *H01L 21/02603* (2013.01);
(Continued)

(58) Field of Classification Search
CPC ......... H01L 29/66545; H01L 29/66795; H01L 29/41791; H01L 21/823814; H01L 27/0924
See application file for complete search history.

(56) References Cited

U.S. PATENT DOCUMENTS 7,615,429 B2   11/2009   Kim et al.
9,209,247 B2   12/2015   Colinge et al.
(Continued)

FOREIGN PATENT DOCUMENTS

CN   106711221 A   5/2017
CN   106816381 A   6/2017
(Continued)

OTHER PUBLICATIONS

Non-final Office Action issued in related U.S. Appl. No. 15/885,359, dated Sep. 10, 2018.
(Continued)

*Primary Examiner* — Zandra V Smith
*Assistant Examiner* — John M Parker
(74) *Attorney, Agent, or Firm* — McDermott Will & Emery LLP

(57) ABSTRACT

In a method, a fin structure, in which first semiconductor layers and second semiconductor layers are alternately stacked, is formed. A sacrificial gate structure is formed over the fin structure. The first semiconductor layers are etched at a source/drain region of the fin structure, which is not covered by the sacrificial gate structure, thereby forming a first source/drain space in which the second semiconductor
(Continued)

layers are exposed. A dielectric layer is formed at the first source/drain space, thereby covering the exposed second semiconductor layers. The dielectric layer and part of the second semiconductor layers are etched, thereby forming a second source/drain space. A source/drain epitaxial layer is formed in the second source/drain space. At least one of the second semiconductor layers is in contact with the source/drain epitaxial layer, and at least one of the second semiconductor layers is separated from the source/drain epitaxial layer.

20 Claims, 37 Drawing Sheets

Related U.S. Application Data continuation of application No. 15/800,940, filed on Nov. 1, 2017, now Pat. No. 10,699,956.

(60) Provisional application No. 62/552,164, filed on Aug. 30, 2017.

(51) Int. Cl.
| | | |
|---|---|---|
| *H01L 27/11* | (2006.01) | |
| *H01L 29/06* | (2006.01) | |
| *H01L 29/423* | (2006.01) | |
| *H01L 29/786* | (2006.01) | |
| *H01L 21/02* | (2006.01) | |
| *H01L 29/66* | (2006.01) | |

(52) U.S. Cl.
CPC ........ *H01L 21/823807* (2013.01); *H01L 21/823878* (2013.01); *H01L 27/092* (2013.01); *H01L 27/1104* (2013.01); *H01L 29/0653* (2013.01); *H01L 29/42392* (2013.01); *H01L 29/66439* (2013.01); *H01L 29/66545* (2013.01); *H01L 29/66742* (2013.01); *H01L 29/78618* (2013.01); *H01L 29/78696* (2013.01); *H01L 27/1108* (2013.01); *H01L 29/0673* (2013.01)

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,627,540 | B1 | 4/2017 | Chen et al. |
| 10,090,193 | B1 | 10/2018 | Chanemougame et al. |
| 10,121,870 | B1 | 11/2018 | Chiang et al. |
| 10,157,799 | B2 | 12/2018 | Ching et al. |
| 10,164,012 | B2 | 12/2018 | Fung et al. |
| 10,790,280 | B2 | 9/2020 | Ching et al. |
| 2008/0099849 | A1* | 5/2008 | Kim .............. H01L 29/42392 257/365 |
| 2015/0069328 | A1 | 3/2015 | Leobandung |
| 2015/0340365 | A1 | 11/2015 | Han |
| 2016/0111513 | A1 | 4/2016 | Liu et al. |
| 2017/0005195 | A1 | 1/2017 | Ching et al. |
| 2017/0140996 | A1 | 5/2017 | Lin et al. |
| 2017/0141112 | A1 | 5/2017 | Ching et al. |
| 2017/0154958 | A1 | 6/2017 | Fung et al. |
| 2017/0154973 | A1 | 6/2017 | Ching et al. |
| 2017/0194213 | A1 | 7/2017 | Ching et al. |

FOREIGN PATENT DOCUMENTS

| | | |
|---|---|---|
| CN | 10693552 A | 7/2017 |
| KR | 10-2017-0063353 A | 6/2017 |

OTHER PUBLICATIONS

Non-final Office Action issued in related U.S. Appl. No. 15/800,940, dated Apr. 18, 2019.

Notice of Allowance issued in related U.S. Appl. No. 15/885,359, dated Apr. 10, 2019.

* cited by examiner

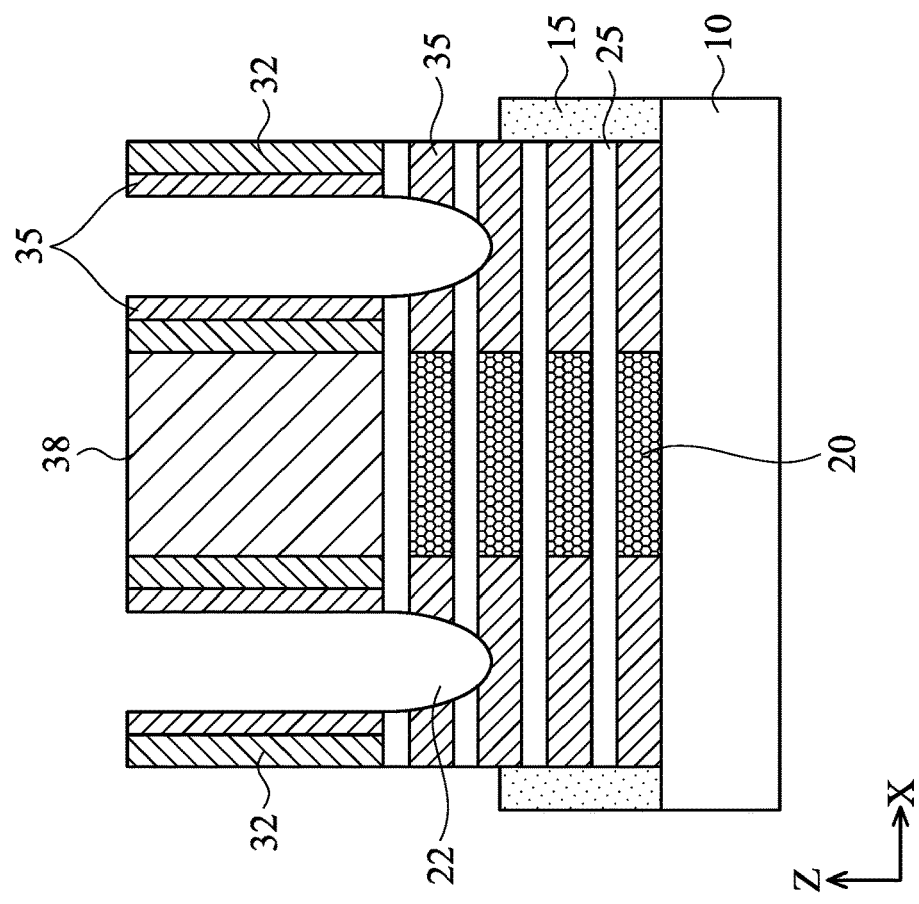
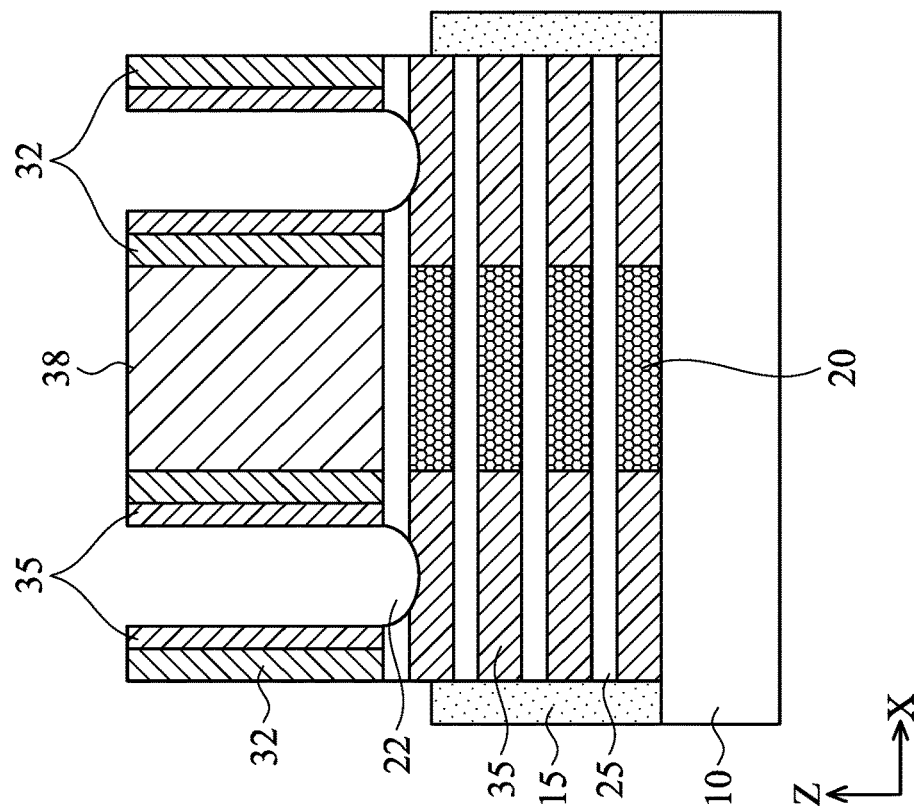
FIG. 12A
FIG. 12B

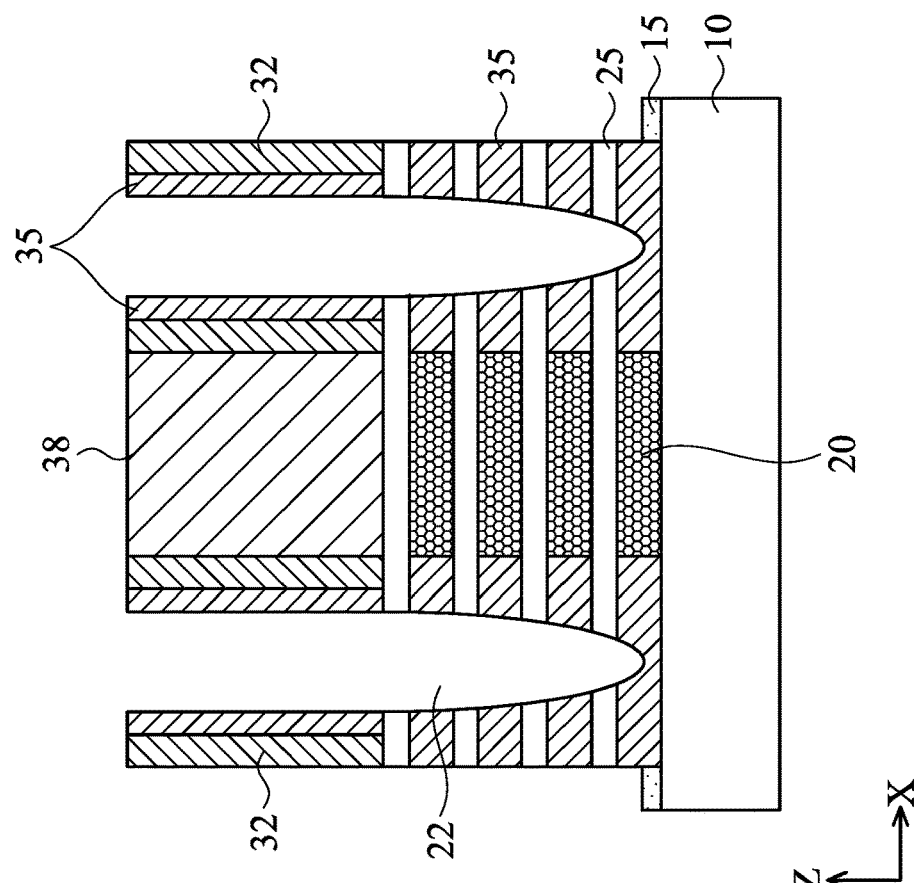
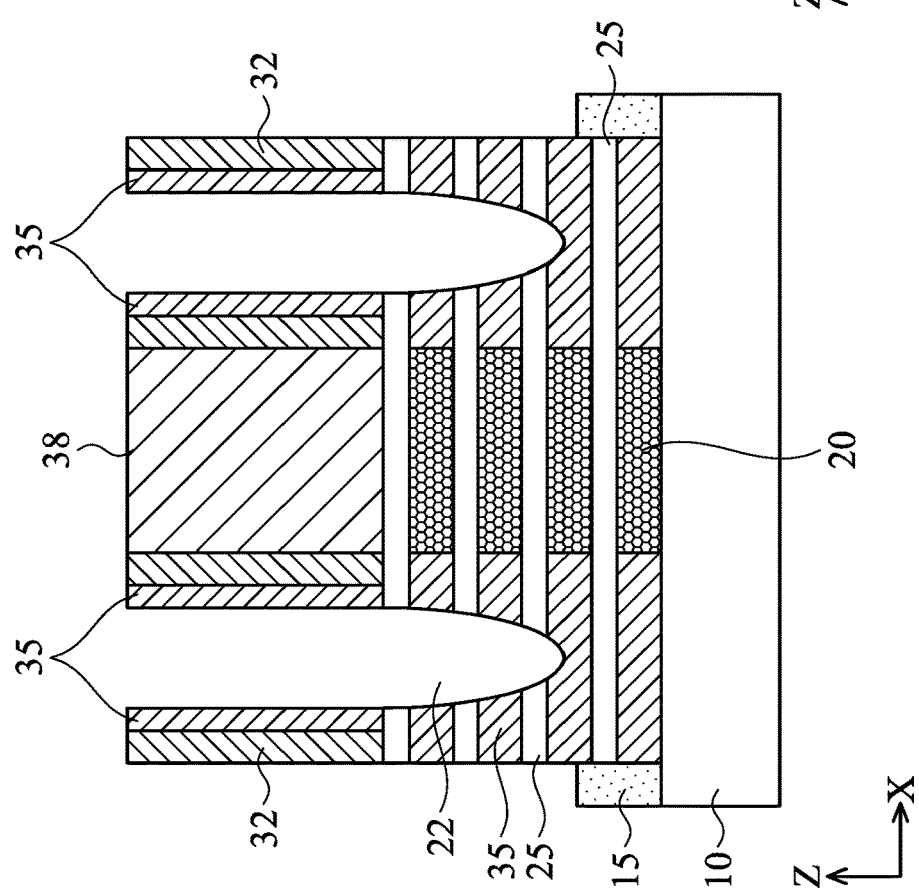
FIG. 12C
FIG. 12D

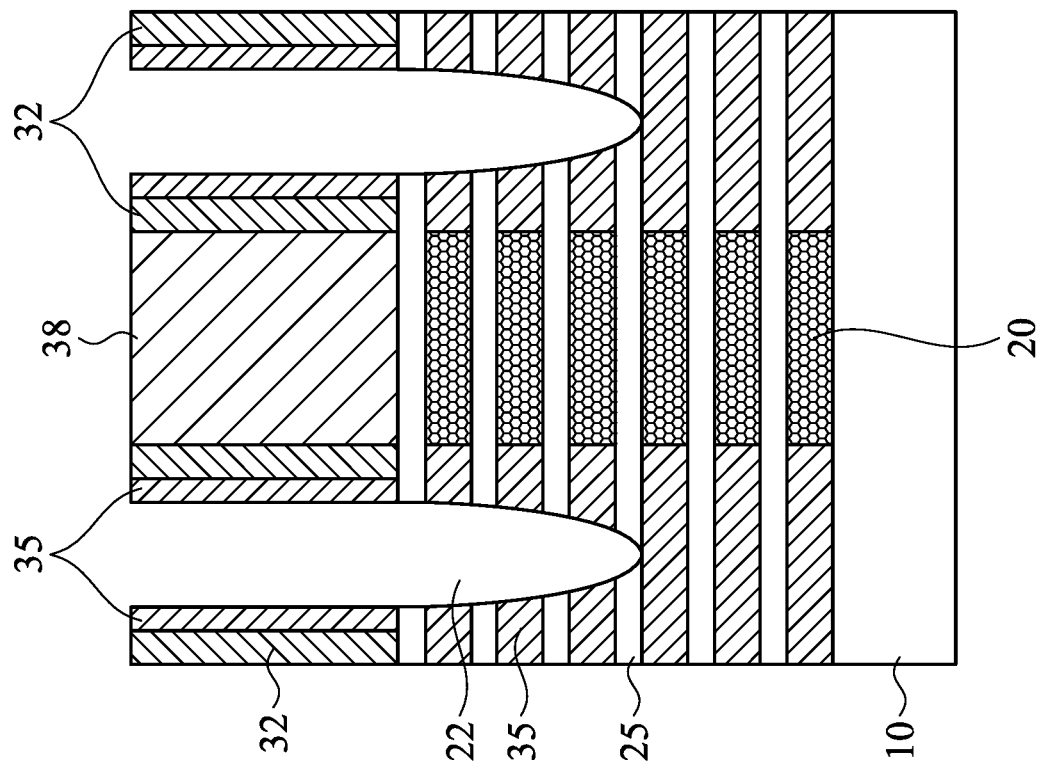
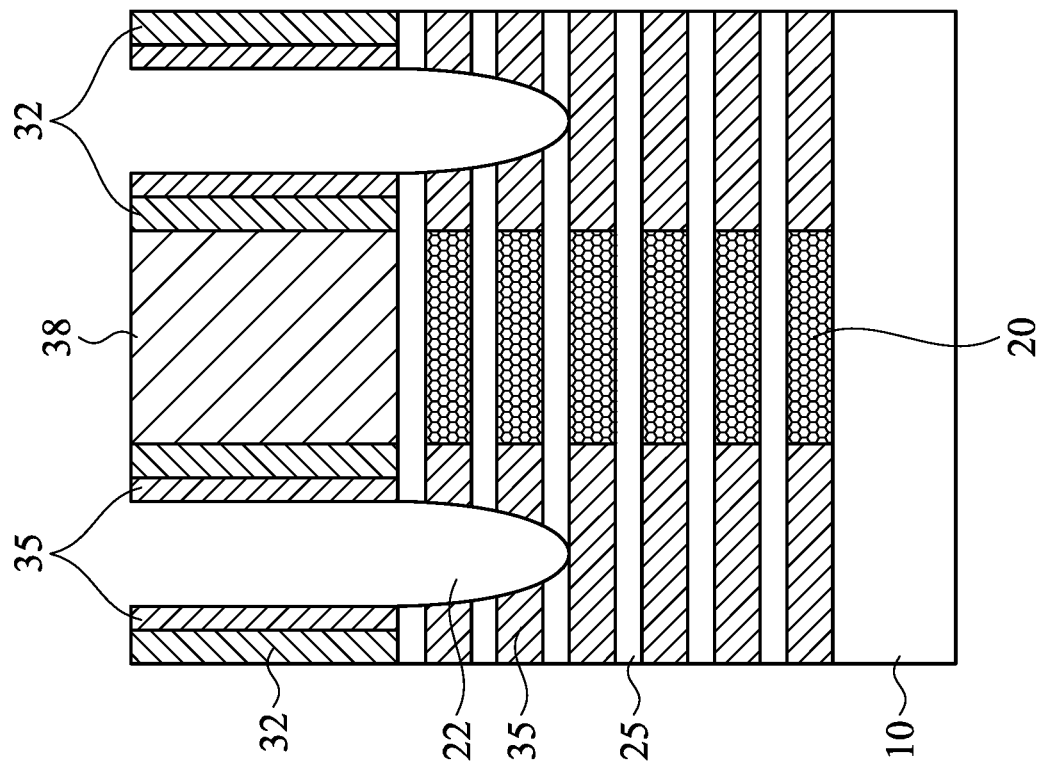
FIG. 13C
FIG. 13D

|        | Etching Depth |         |         |
|--------|---------|---------|---------|
|        | D       | 2xD     | 4xD     |
| 1 Wire | Etch    | (Cover) | (Cover) |
| 2 Wire | (Cover) | Etch    | (Cover) |
| 3 Wire | Etch    | Etch    | (Cover) |
| 4 Wire | (Cover) | (Cover) | Etch    |
| 5 Wire | Etch    | (Cover) | Etch    |
| 6 Wire | (Cover) | Etch    | Etch    |

FIG. 14

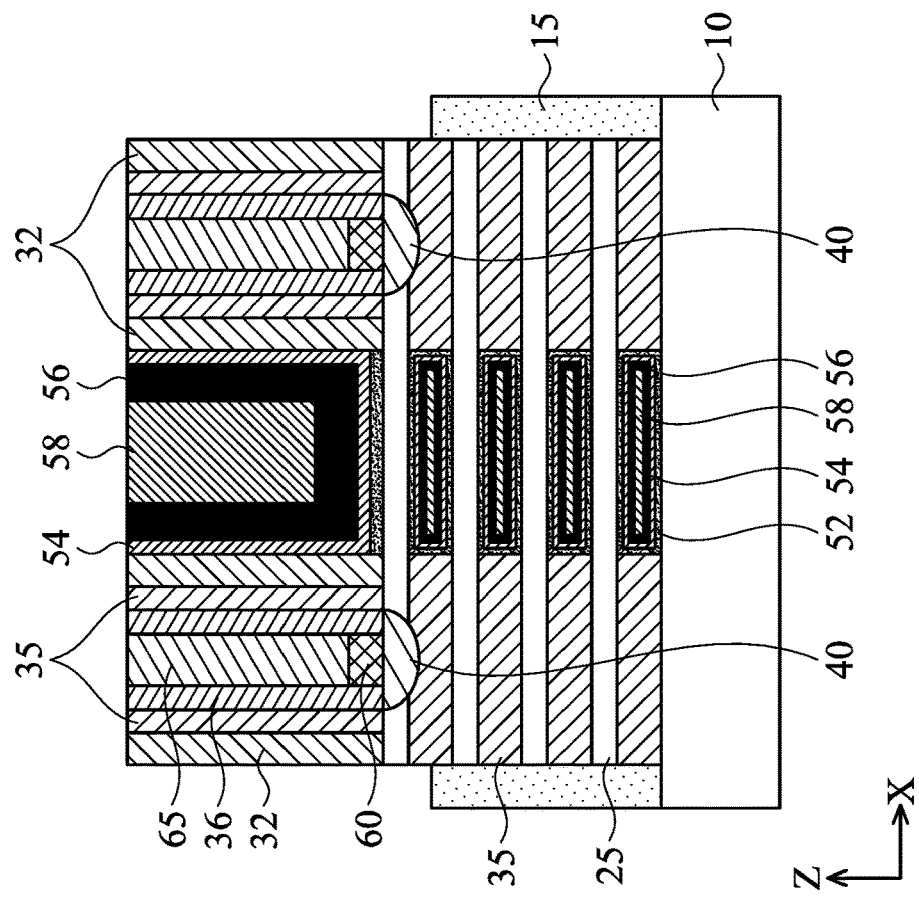
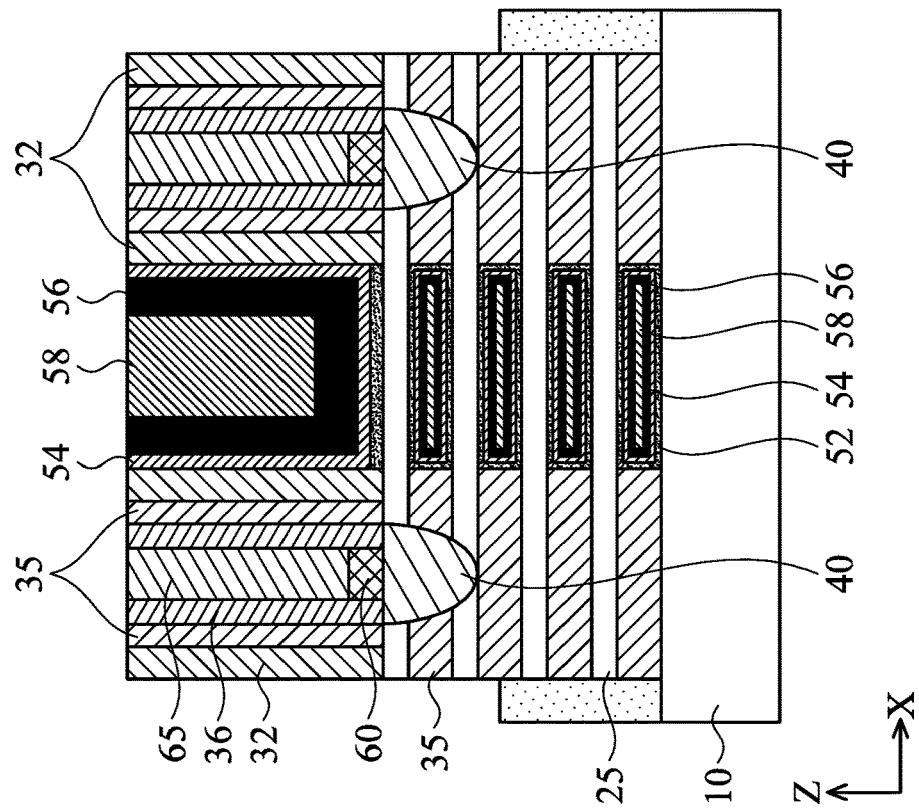
FIG. 21D
FIG. 21C

| PU | PG | PD | SNM Vmin | Write Vmin |
|----|----|----|----------|------------|
| 1 | 1 | 1 | Normal | Poor (Need assist) |
| 1 | 1 | 2 | Good | Poor (Need assist) |
| 1 | 2 | 2 | Normal | Normal |
| 1 | 2 | 3 | Good | Normal |
| 1 | 3 | 3 | Normal | Good |
| 1 | 3 | 4 | Good | Good |
| 1 | 4 | 4 | Normal | Very Good |
| 2 | 3 | 3 | Good | Normal |
| 2 | 3 | 4 | Very Good | Normal |
| 2 | 4 | 4 | Good | Good |
| 3 | 4 | 4 | Very Good | Normal |

FIG. 29B

METHOD OF MANUFACTURING A SEMICONDUCTOR DEVICE AND A SEMICONDUCTOR DEVICE

CROSS-REFERENCE TO RELATED APPLICATION

This application is a divisional of U.S. patent application Ser. No. 15/885,359 filed Jan. 31, 2018, now U.S. Pat. No. 10,403,550, which is a continuation-in-part of application Ser. No. 15/800,940 filed on Nov. 1, 2017, which claims priority of Provisional Application No. 62/552,164 filed on Aug. 30, 2017, the entire contents of each of which are incorporated herein by reference.

TECHNICAL FIELD

The disclosure relates to method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin-FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 12A, 12B, 12C and 12D show one of the various stages of manufacturing a semiconductor FET device according to an embodiment of the present disclosure.

FIGS. 13A, 13B, 13C, 13D, 13E and 13F show one of the various stages of manufacturing a semiconductor FET device according to an embodiment of the present disclosure.

FIG. 14 shows various etching operations for manufacturing structures shown in FIGS. 13A-13F.

FIGS. 21A, 21B, 21C and 21D show one of the various stages of manufacturing a semiconductor FET device according to an embodiment of the present disclosure.

FIG. 29A shows a static random access memory (SRAM) cell diagram and FIG. 29B shows various transistor properties for the SRAM cell according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In a GAA FET, a driving current can be adjusted by changing dimensions (e.g., a cross sectional area) of each semiconductor wires constituting channel regions and/or by changing the number of semiconductor wires vertically arranged over a substrate. However, it is generally difficult to manufacture GAA FETs with different numbers of semiconductor wires within one semiconductor chip.

In the present disclosure, the driving current of GAA FETs is modulated by changing the number of semiconductor wires electrically connected to a source/drain epitaxial layer. In this disclosure, a source/drain refers to a source and/or a drain. It is noted that in the present disclosure, a source and a drain are interchangeably used and the structures thereof are substantially the same, unless otherwise described.

Figure 1:
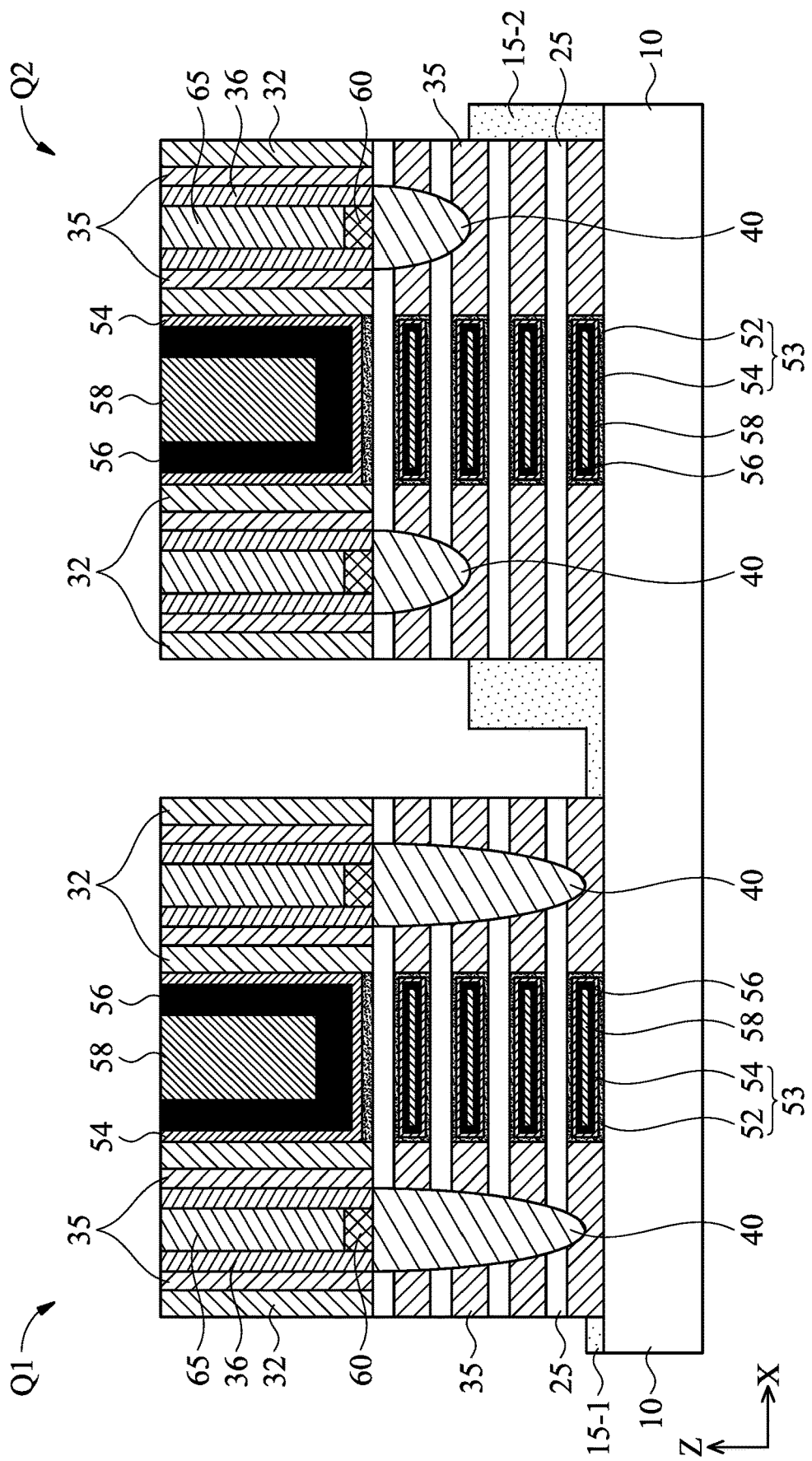
FIG. 1 shows a cross sectional view of a semiconductor FET device according to an embodiment of the present disclosure.

FIG. 1 shows a cross sectional view of a semiconductor FET device according to an embodiment of the present disclosure.

As shown in FIG. 1, a first GAA FET Q1 and a second GAA FET Q2 are disposed over a substrate 10. In each of the first and second GAA FETs, semiconductor wires 25 are provided over the semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

In each of the first and second GAA FETs, the semiconductor wires 25, which are channel layers, are disposed over the substrate 10. In some embodiments, the semiconductor wires 25 are disposed over a fin structure (not shown) protruding from the substrate 10. Each of the channel layers 25 is wrapped around by a gate dielectric layer 53 and a gate electrode layer 58. In some embodiments, the gate dielectric layer 53 includes an interfacial layer 52 and a high-k dielectric layer 54. The gate structure includes the gate dielectric layer 53, the gate electrode layer 58 and sidewall spacers 32. Although FIG. 1 shows four semiconductor wires 25, the number of the semiconductor wires 25 is not limited to four, and may be as small as one or more than four and may be up to fifteen (15).

In certain embodiments of the present disclosure, one or more work function adjustment layers 56 are interposed between the gate dielectric layer 53 and the gate electrode layer 58.

In each of the first and second GAA FETs, a source/drain epitaxial layer 40 is disposed over the substrate 10. The source/drain epitaxial layer 40 is in direct contact with the channel layer 25, and is separated by a dielectric layer 35 as inner spacers and the gate dielectric layer 53 from the gate electrode layer 58. The dielectric layer 35 is made of a low-k (low dielectric constant lower than the dielectric constant of SiO$_2$) material. The low-k material includes SiOC, SiOCN, organic material or porous material, or any other suitable material.

An interlayer dielectric (ILD) layer 36 is disposed over the S/D epitaxial layer 40 and a conductive contact layer 60 is disposed on the S/D epitaxial layer 40 and a conductive plug 65 passing though the ILD layer 36 is disposed over the conductive contact layer 60. The conductive contact layer 60 includes one or more layers of conductive material. In some embodiments, the conductive contact layer 60 includes a silicide layer, such as WSi, NiSi, TiSi or CoSi or other suitable silicide material.

The first GAA FET Q1 and the second GAA FET Q2 have substantially the same structure except for the source/drain regions. As shown in FIG. 1, the source/drain epitaxial layer 40 of the first GAA FET Q1 is in physical and electrical contact with all of the semiconductor wires 25, while the source/drain epitaxial layer 40 of the second GAA FET Q2 is in physical and electrical contact with only some of the semiconductor wires 25. In some embodiments, as shown in FIG. 1, the source/drain epitaxial layer 40 of the second GAA FET Q2 is in physical and electrical contact with two of the four semiconductor wires 25. In other words, at least one of the semiconductor wires 25 of the second GAA FET Q2 is electrically separated from the source/drain epitaxial layer 40 disposed thereabove, by the dielectric layer 35.

In certain embodiments, at least one of the semiconductor wires 25 of the first GAA FET Q1 is electrically separated from the source/drain epitaxial layer 40 disposed thereabove, by the dielectric layer 35. In such a case, the number of the semiconductor wires 25 contacting the source/drain epitaxial layer 40 in the first GAA FET Q1 is the same as or different from the number of the semiconductor wires 25 contacting the source/drain epitaxial layer 40 in the second GAA FET Q2.

As shown in FIG. 1, when one or more of the semiconductor wires 25 are not in contact with the source/drain epitaxial layer 40 in the source/drain region, the one or more of the semiconductor wires 25 not in contact with the source/drain epitaxial layer 40 are wrapped with the gate dielectric layer 53 and the gate electrode layer 58.

One or more of the semiconductor wires 25 are electrically separated from the source/drain epitaxial layer 40, they are located closer to the substrate 10 than the remaining semiconductor wires 25 contacting the source/drain epitaxial layer.

In some embodiments, two or more of the semiconductor wires 25 are electrically separated from the source/drain epitaxial layer 40. In other embodiments, only one of the semiconductor wires 25 is in contact with the source/drain epitaxial layer 40.

By adjusting the number of the semiconductor wires 25 contacting the source/drain epitaxial layer 40, it is possible to adjust a driving current of a GAA FET. When the number is larger, the driving current increases, and when the number is smaller, an input capacitance can be reduced and an operational speed can be increased.

As set forth above, FIG. 1 shows GAA FETs. However, the structures do not necessarily function as a transistor. In some embodiments, the structures shown in FIG. 1 can function as resistors. In such a case, the gate electrode is coupled to a fixed potential, such as Vdd (e.g., positive power supply), 1/2Vdd or Vss (e.g., the ground). The resistance value can be adjusted by adjusting the number of the semiconductor wires 25 contacting the source/drain epitaxial layer 40. For example, assuming that the resistance value between the source and drain is 4R when the number of the semiconductor wires 25 contacting the source/drain epitaxial layer 40 is one, the resistance values 2R, 1.25R and R can be obtained when the number of the semiconductor wires 25 contacting the source/drain epitaxial layer 40 is two, three and four, respectively.

Figure 5A:
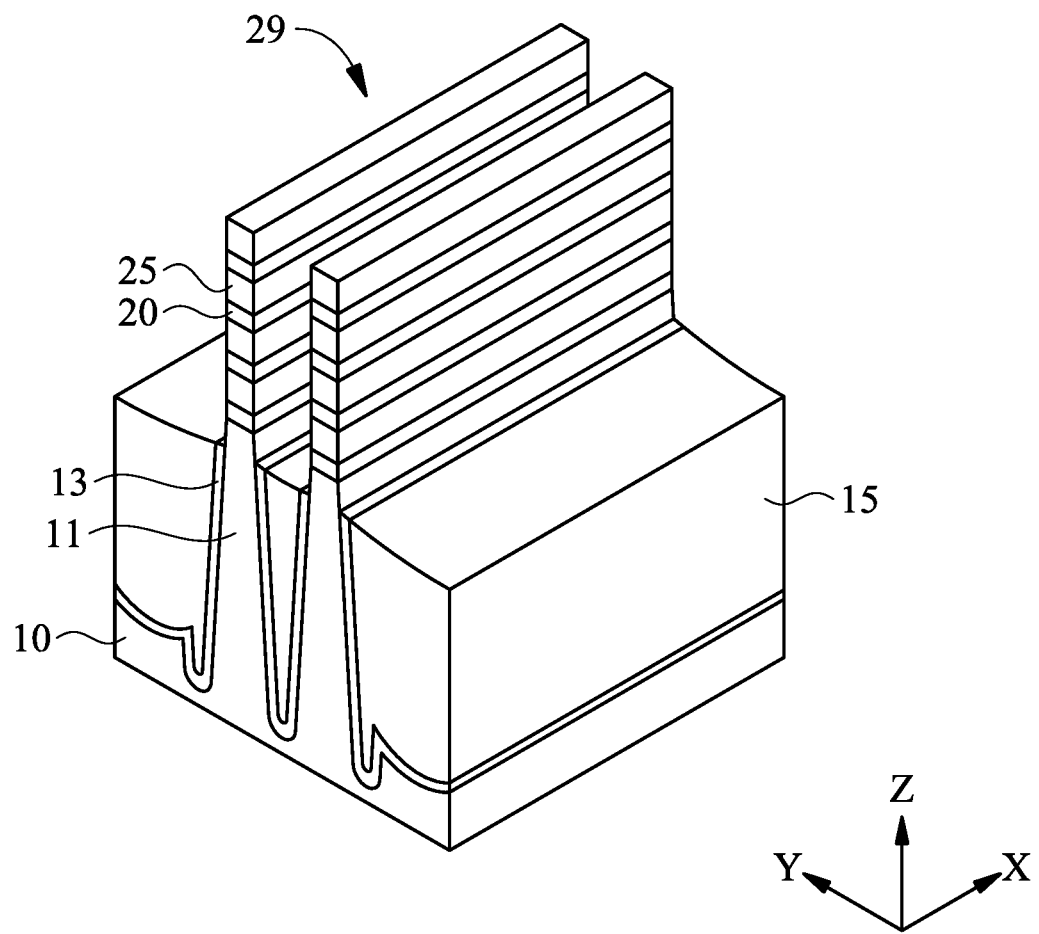
FIG. 5A shows one of the various stages of manufacturing a semiconductor FET device according to an embodiment of the present disclosure.

The semiconductor device further includes an isolation insulating layer (also called as shallow trench isolation (STI) 15 (see, FIG. 5A). In some embodiments, the height of the isolation insulating layer from the upper surface of the substrate 10 is different between the first GAA FET Q1 and a second GAA FET Q2. The height of the isolation insulating layer 15-1 around the first GAA FET Q1, which has a deep source/drain epitaxial layer 40, is smaller than the height of the isolation insulating layer 15-2 around the first GAA FET Q2, which has a shallow source/drain epitaxial layer 40. In other words, GAA FETs having different numbers of wires are surrounded by isolation insulating layers have different thickness (height). In some embodiments, the smaller the number of the wires used in the GAA FET is, the higher (thicker) the isolation insulating layer is. In some embodiments, the upper surface of the isolation insulating layer is located at the level between the bottom of the source/drain epitaxial layer 40 and the semiconductor wire 25 which is not in contact with the source/drain epitaxial layer 40 or the substrate.

FIGS. 2-21D show various stages of manufacturing a semiconductor FET device according to an embodiment of the present disclosure. It is understood that additional operations can be provided before, during, and after processes shown by FIGS. 2-21D, and some of the operations described below can be replaced or eliminated, for additional embodiments of the method. The order of the operations/processes may be interchangeable. Material, configuration, dimensions and/or processes the same as or similar to the foregoing embodiments described with respect to FIG. 1 may be employed in the embodiment of FIGS. 2-21D, and detailed explanation thereof may be omitted. General methods of manufacturing a GAA FET can be found in U.S. patent application Ser. No. 15/157,139, application Ser. No. 15/064,402 and/or application Ser. No. 15,098,073, the entire contents of each of which are incorporated herein by reference.

Figure 2:
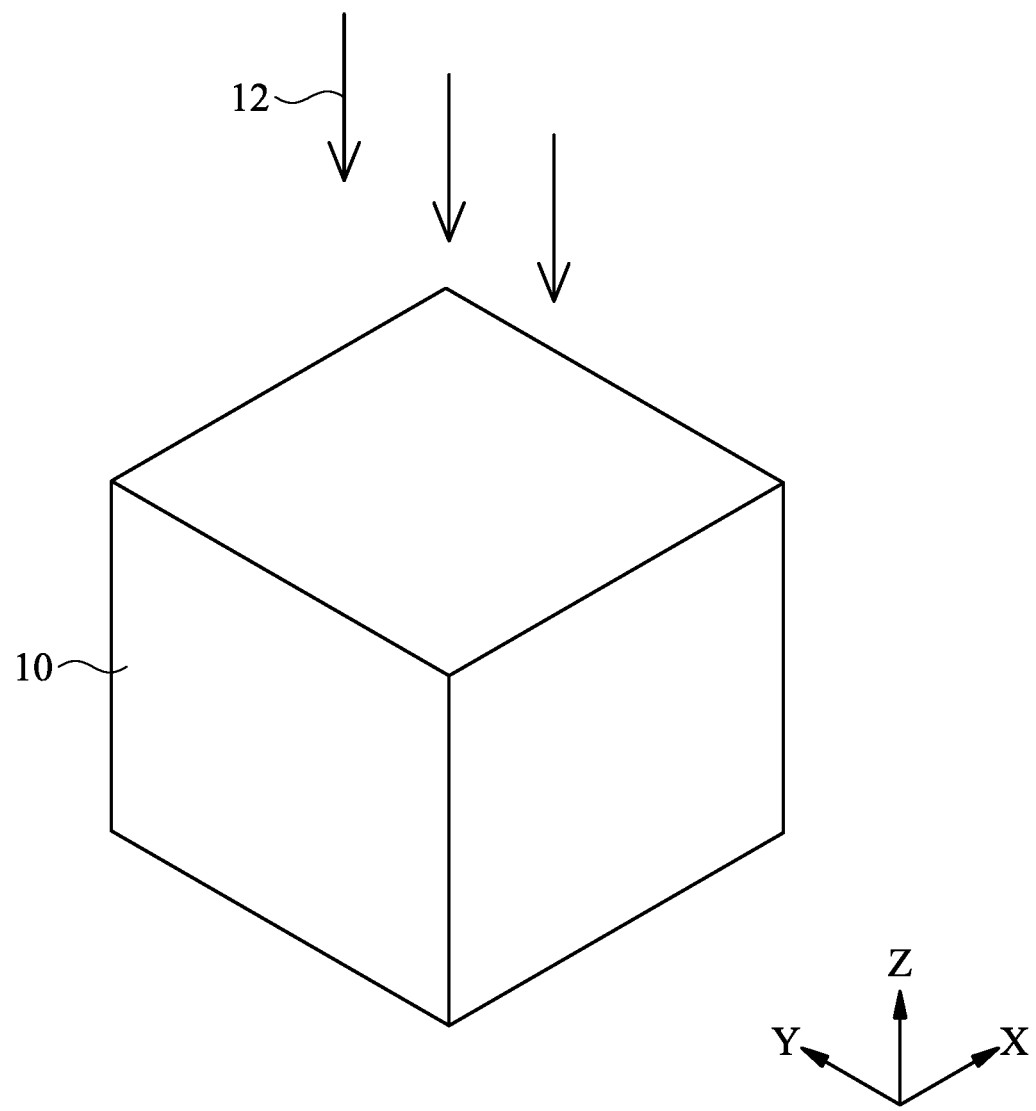
FIG. 2 shows one of the various stages of manufacturing a semiconductor FET device according to an embodiment of the present disclosure.

As shown in FIG. 2, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example boron (BF$_2$) for an n-type Fin FET and phosphorus for a p-type Fin FET.

Figure 3:
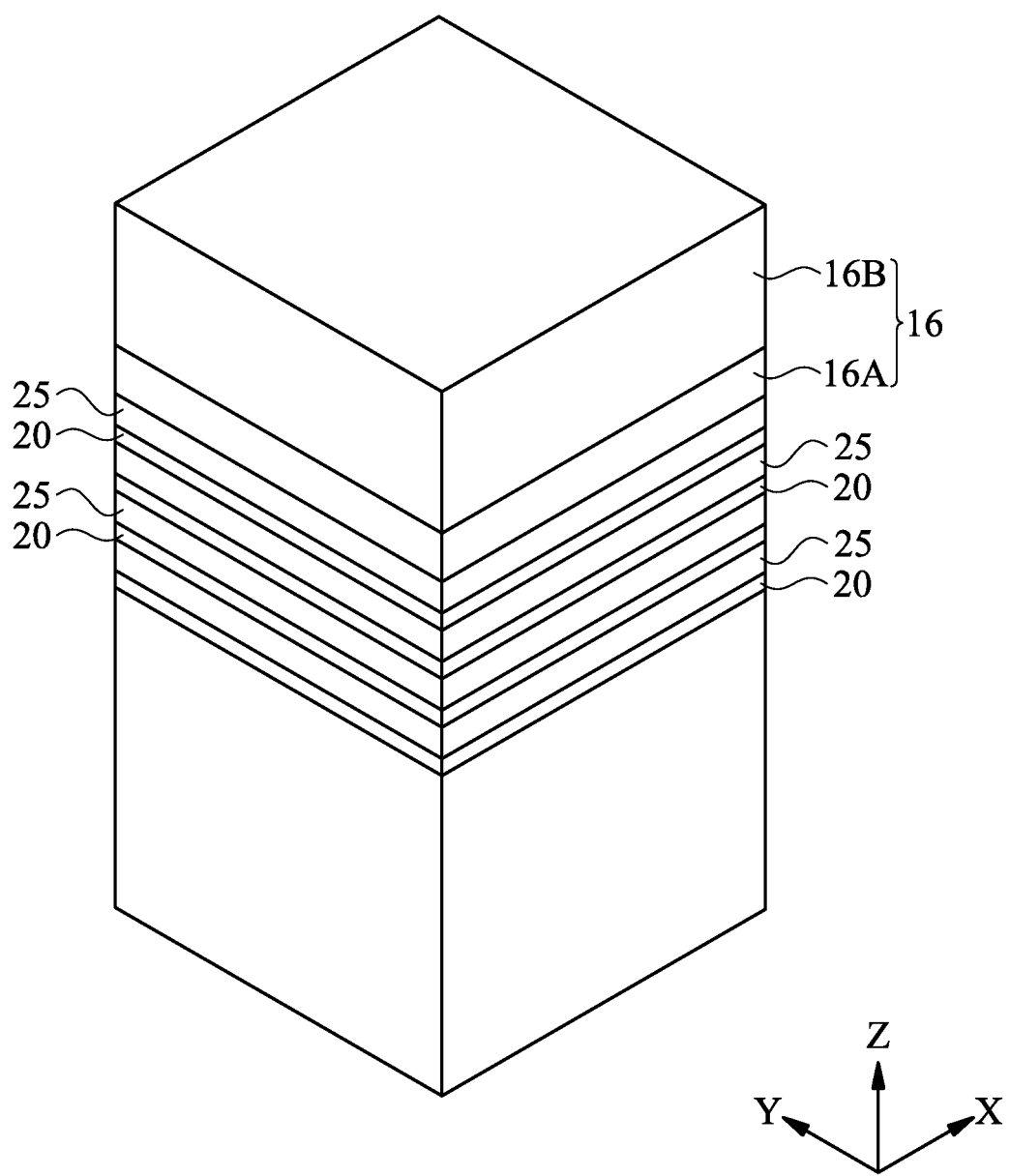
FIG. 3 shows one of the various stages of manufacturing a semiconductor FET device according to an embodiment of the present disclosure.

Then, as shown in FIG. 3, stacked semiconductor layers are formed over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are Si$_{1-x}$Ge$_x$, where x is more than about 0.3, or Ge (x=1.0) and the second semiconductor layers 25 are Si or Si$_{1-y}$Ge$_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-y}Ge_y$, where y is in a range from about 0.1 to about 0.4.

In FIG. 3, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 4:
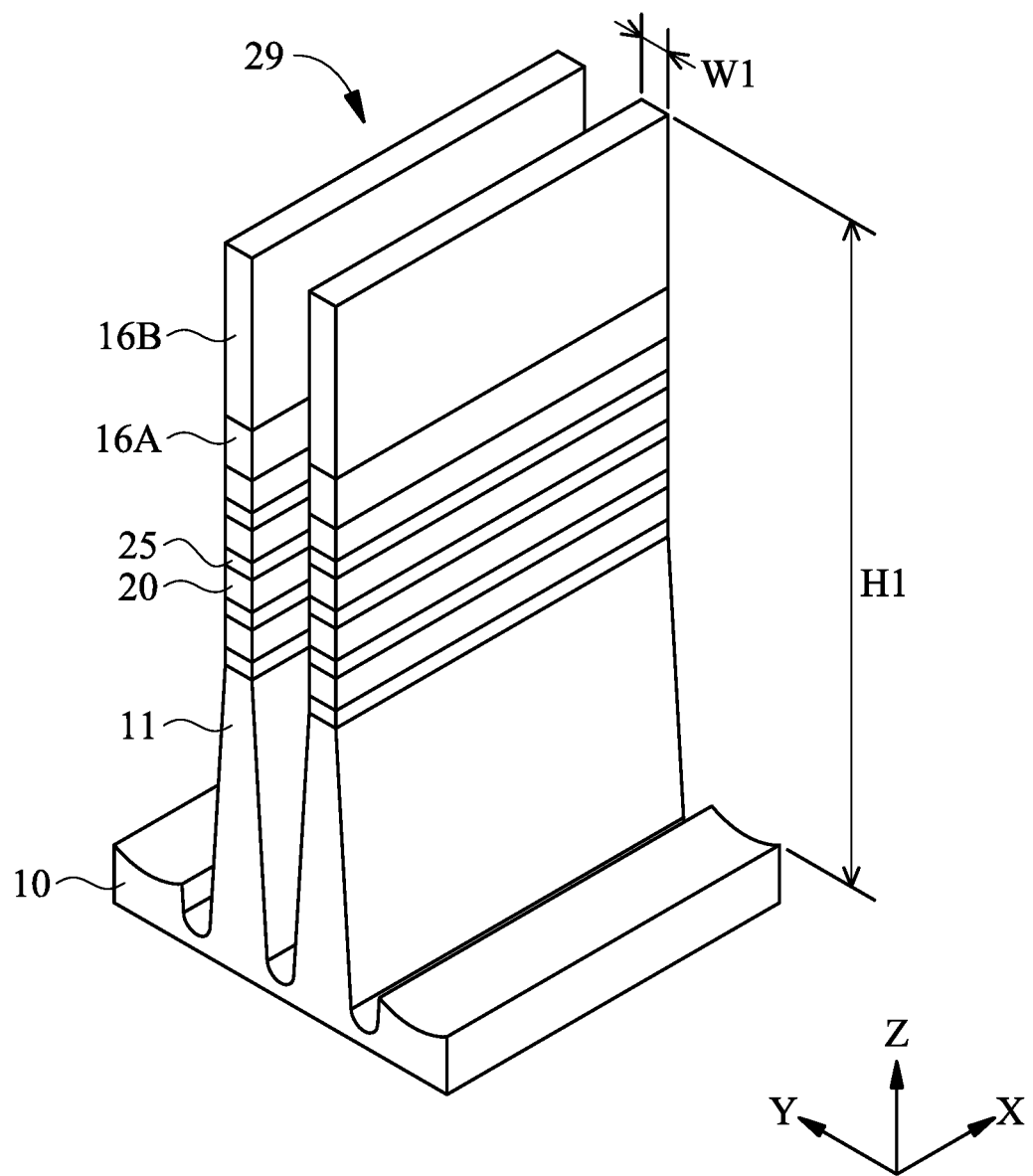
FIG. 4 shows one of the various stages of manufacturing a semiconductor FET device according to an embodiment of the present disclosure.

Next, as shown in FIG. 4, the stacked layers of the first and second semiconductor layers 20, 25 are patterned by using the patterned mask layer 16, thereby the stacked layers are formed into fin structures 29 extending in the X direction. In FIG. 4, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. As shown in FIG. 4 the fin structures 29 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Then, as shown in FIG. 5A, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In the embodiment shown in FIG. 5A, the isolation insulating layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a GAA FET.

Figure 5B:
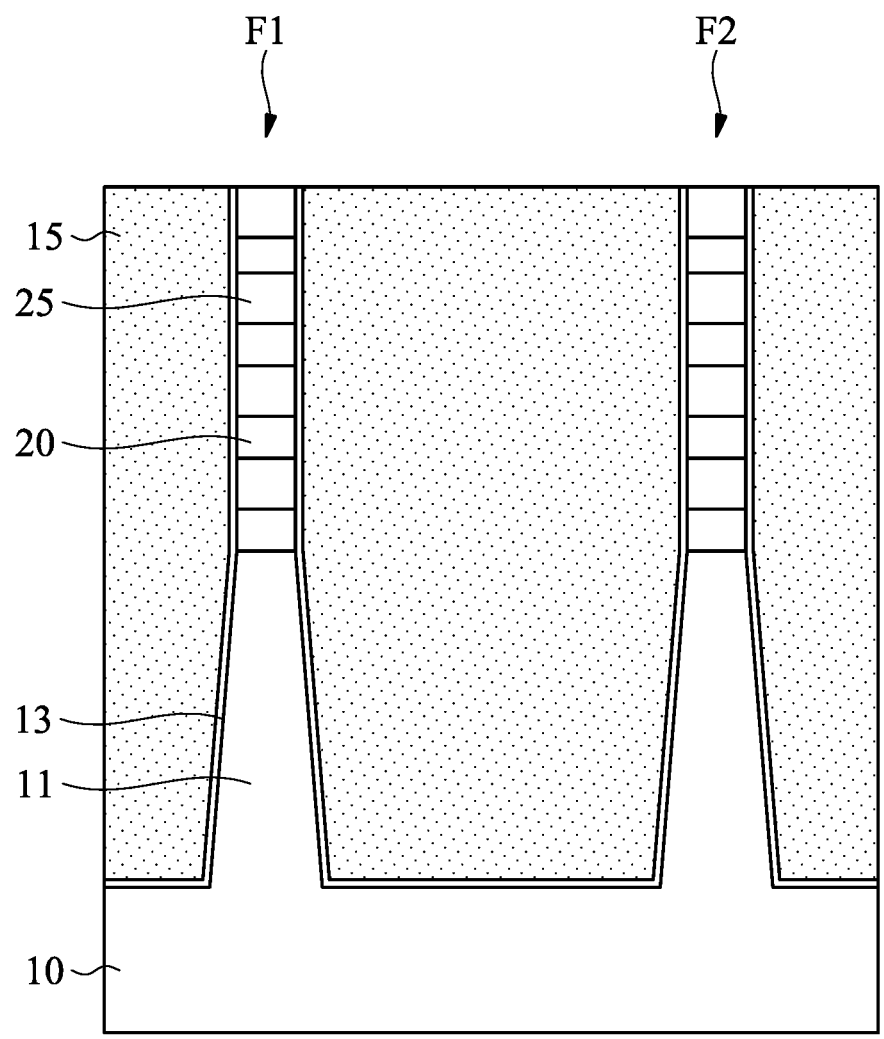
FIG. 5B shows one of the various stages of manufacturing a semiconductor FET device according to an embodiment of the present disclosure.

In some embodiments, as shown in FIGS. 5B-5E, the isolation insulating layer 15 are formed in different heights. As set forth above, an insulating material for the isolation insulating layer 15 is formed over the fin structures F1 and F2, and then a planarization operation, such as a chemical mechanical polishing (CMP) method and/or an etch-back method, is performed such that the upper surface of the uppermost second semiconductor layer 25 of the fin structures F1 and F2 is exposed from the isolation insulating layer 15, as shown in FIG. 5B.

Figure 5C:
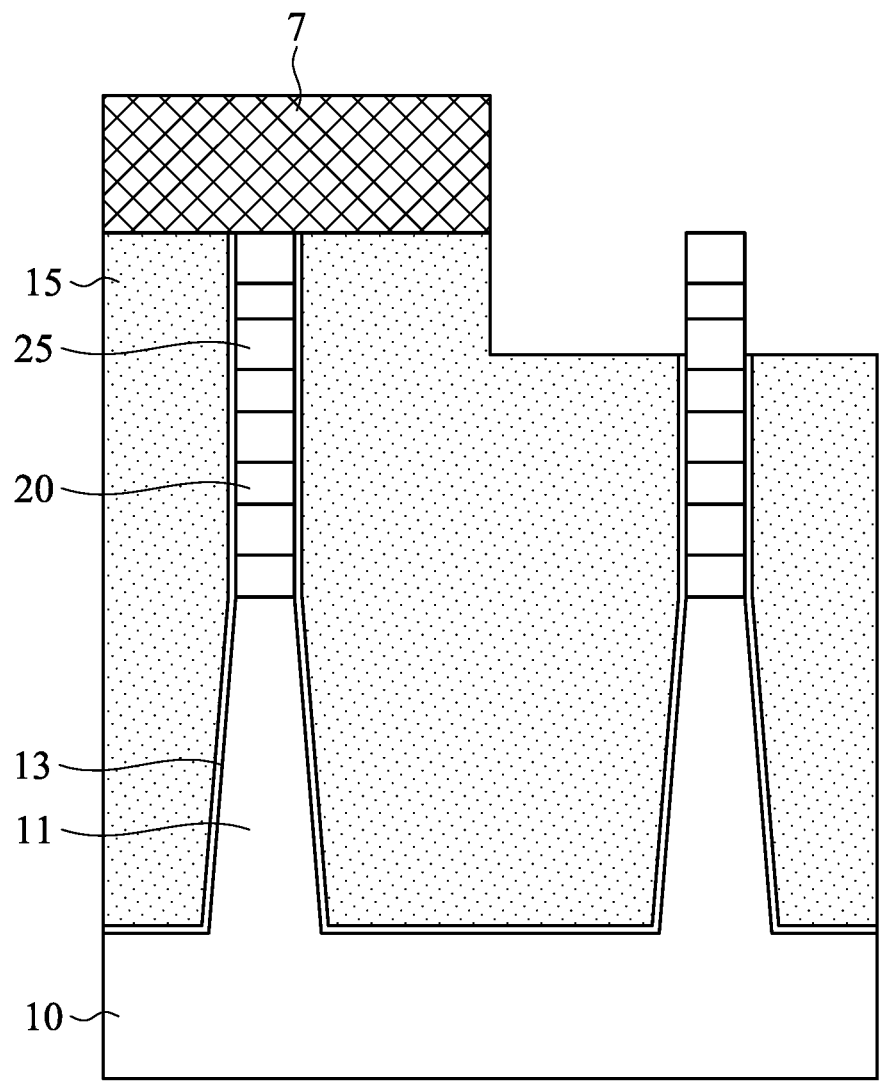
FIG. 5C shows one of the various stages of manufacturing a semiconductor FET device according to an embodiment of the present disclosure.
Figure 5D:
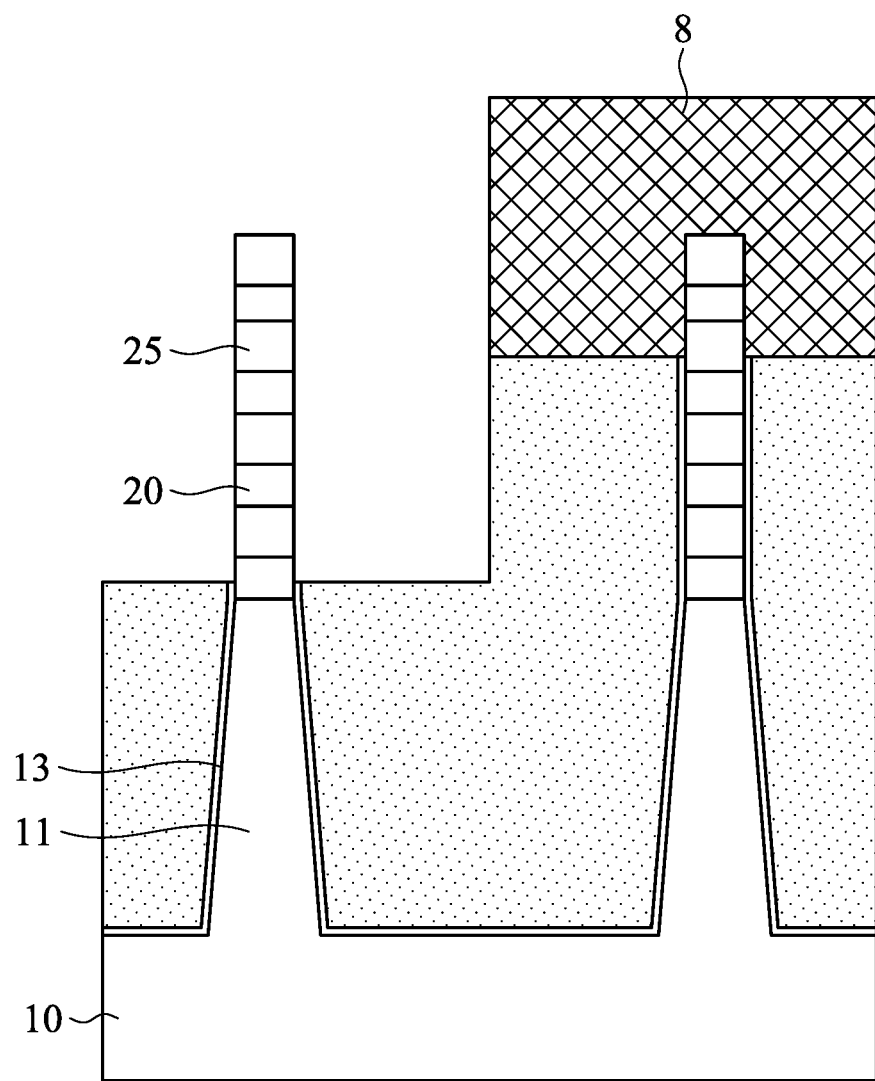
FIG. 5D shows one of the various stages of manufacturing a semiconductor FET device according to an embodiment of the present disclosure.
Figure 5E:
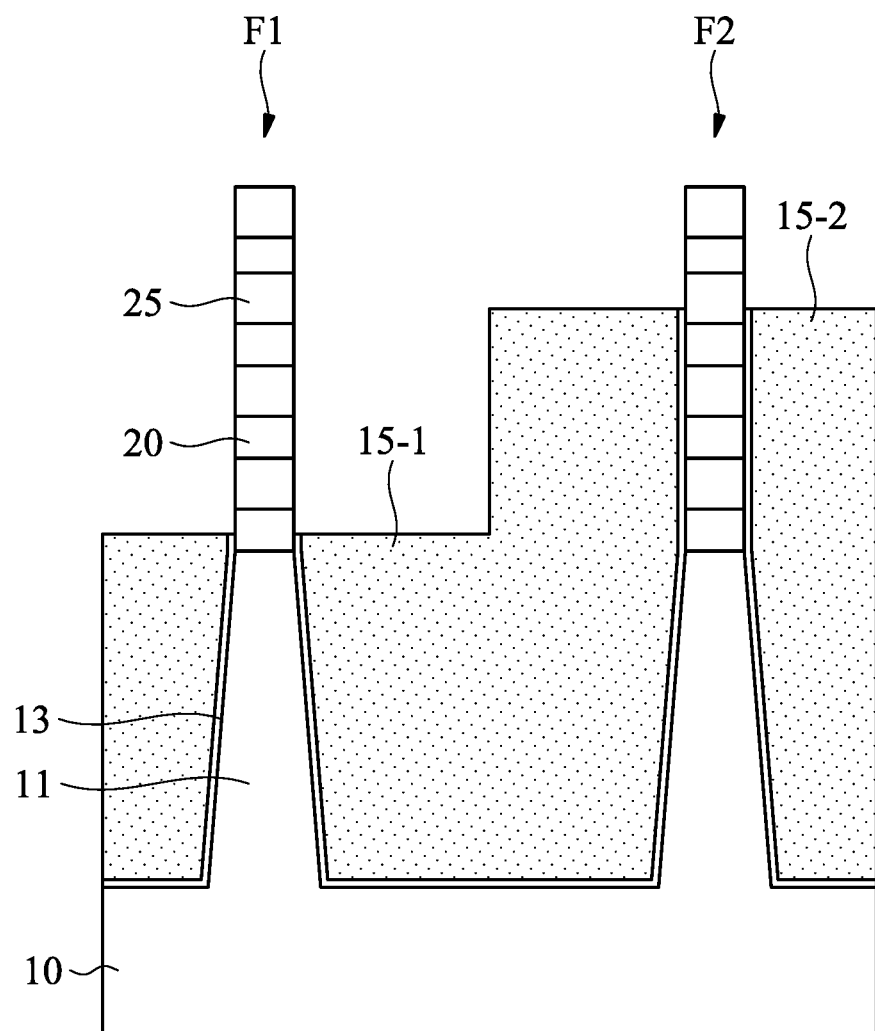
FIG. 5E shows one of the various stages of manufacturing a semiconductor FET device according to an embodiment of the present disclosure.

Then, as shown in FIG. 5C, a mask layer 7, for example a photo resist layer, is formed over the fin structure F1, and the isolation insulating material around the fin structure F2 is recessed to a designed level depending on the number of wires used, to form the deep isolation insulating layer 15-1. Subsequently, the mask layer 7 is removed. Further, as shown in FIG. 5D, a mask layer 8, for example a photo resist layer, is formed over the fin structure F2, and the isolation insulating material around the fin structure F1 is recessed to a designed level depending on the number of wires used, to form the shallow isolation insulating layer 15-2. Subsequently, the mask layer 8 is removed, and thus the structure shown in FIG. 5E is obtained. The order of etching operation can be interchanged.

Figure 6:
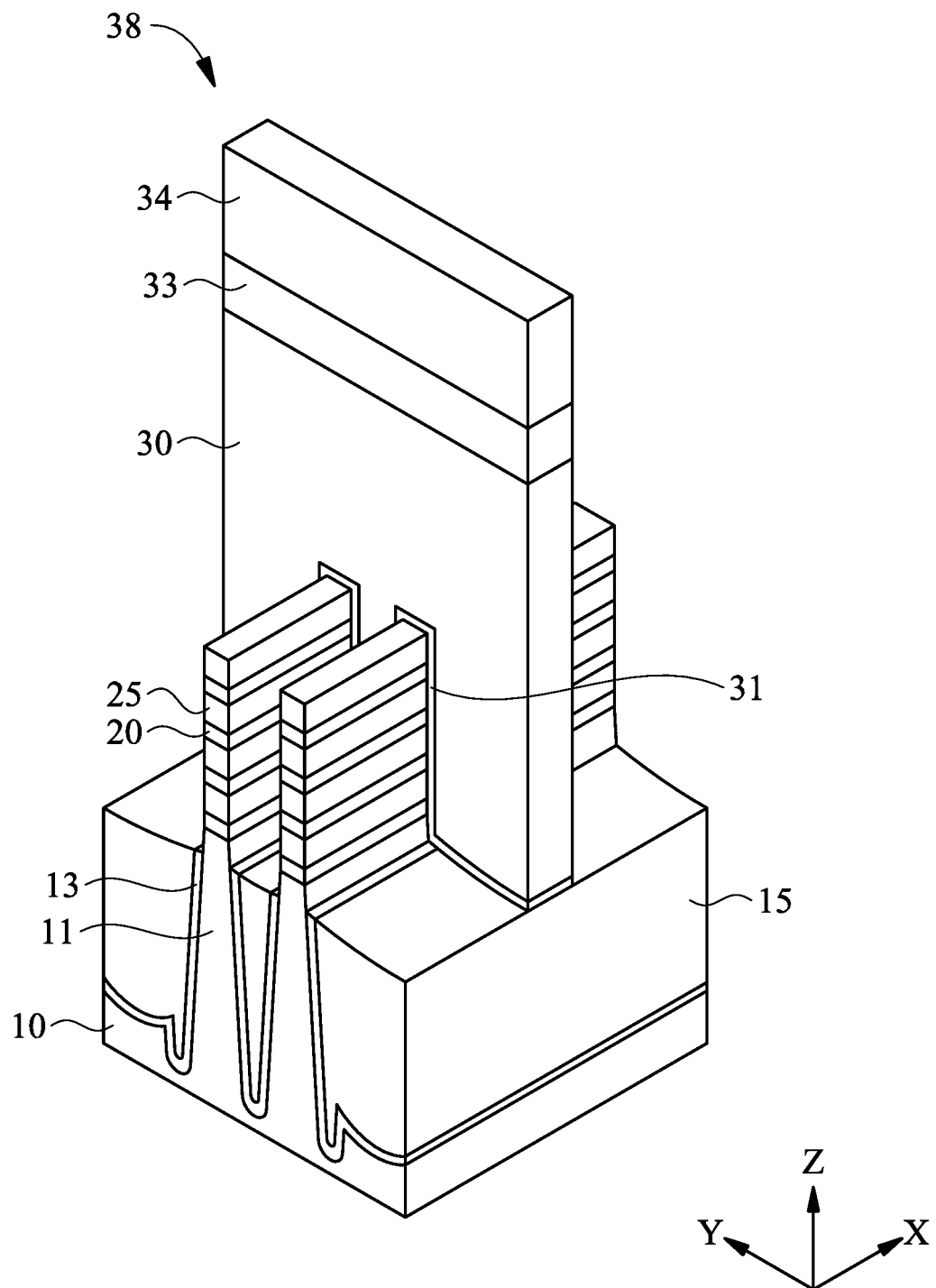
FIG. 6 shows one of the various stages of manufacturing a semiconductor FET device according to an embodiment of the present disclosure.

After the isolation insulating layer 15 (or isolation insulating layers having different thicknesses) is formed, a sacrificial (dummy) gate structure 38 is formed, as shown in FIG. 6. FIG. 6 illustrates a structure after a sacrificial gate structure 38 is formed over the exposed fin structures 29. The sacrificial gate structure 38 is formed over a portion of the fin structures which is to be a channel region. The sacrificial gate structure 38 defines the channel region of the GAA FET. The sacrificial gate structure 38 includes a sacrificial gate dielectric layer 31 and a sacrificial gate electrode layer 30. The sacrificial gate dielectric layer 31 includes one or more layers of insulating material, such as a silicon oxide-based material. In one embodiment, silicon oxide formed by CVD is used. The thickness of the sacrificial gate dielectric layer 31 is in a range from about 1 nm to about 5 nm in some embodiments.

The sacrificial gate structure 38 is formed by first blanket depositing the sacrificial gate dielectric layer 31 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 33 and a silicon oxide mask layer 34.

Next, a patterning operation is performed on the mask layer and sacrificial gate electrode layer is patterned into the sacrificial gate structure 38, as shown in FIG. 6. The sacrificial gate structure includes the sacrificial gate dielectric layer 31, the sacrificial gate electrode layer 30 (e.g., poly silicon), the pad SiN layer 33 and the silicon oxide mask layer 34. By patterning the sacrificial gate structure, the stacked layers of the first and second semiconductor layers are partially exposed on opposite sides of the sacrificial gate structure, thereby defining source/drain (S/D) regions, as shown in FIG. 6. In FIG. 6, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 7:
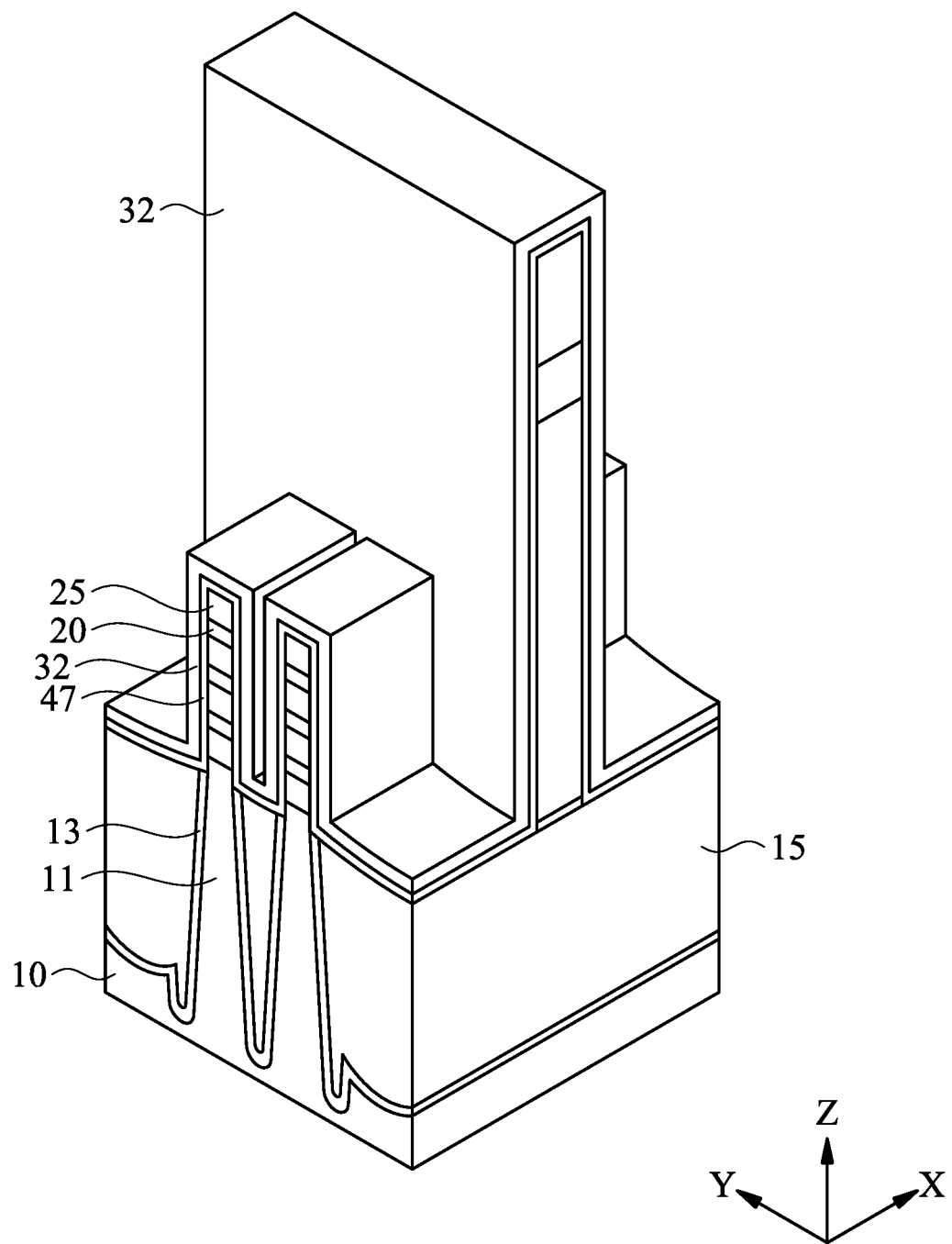
FIG. 7 shows one of the various stages of manufacturing a semiconductor FET device according to an embodiment of the present disclosure.

Further, a cover layer for sidewall spacers 32 is formed over the sacrificial gate structure 38, as shown in FIG. 7. The cover layer 32 is deposited in a conformal manner so that it is formed to have substantially equal thicknesses on vertical surfaces, such as the sidewalls, horizontal surfaces, and the top of the sacrificial gate structure, respectively. In some embodiments, the cover layer 32 has a thickness in a range from about 5 nm to about 20 nm. The cover layer 32 includes one or more of SiN, SiON and SiCN or any other suitable dielectric material. The cover layer 32 can be formed by ALD or CVD, or any other suitable method.

In certain embodiments, before the cover layer 32 is formed, an additional cover layer 47 made of an insulating material is conformally formed over the exposed fin structures and the sacrificial gate structure 38. In such a case, the additional cover layer and the cover layer are made of different materials so that one of them can be selectively etched. The additional cover layer 47 includes a low-k dielectric material, such as SiOC and/or SiOCN or any other suitable dielectric material and can be formed by ALD or CVD, or any other suitable method.

Although FIGS. 2-7 shows the structure in which one sacrificial gate structure is disposed over two fin structures, the structure is not limited to one sacrificial gate structure. In some embodiments, two or more sacrificial gate structures are disposed over one or more fin structures. Further, two or more of the structure shown in FIG. 7 are disposed in different areas (e.g., p-type regions and/or n-type regions) on the semiconductor substrate.

Figure 8:
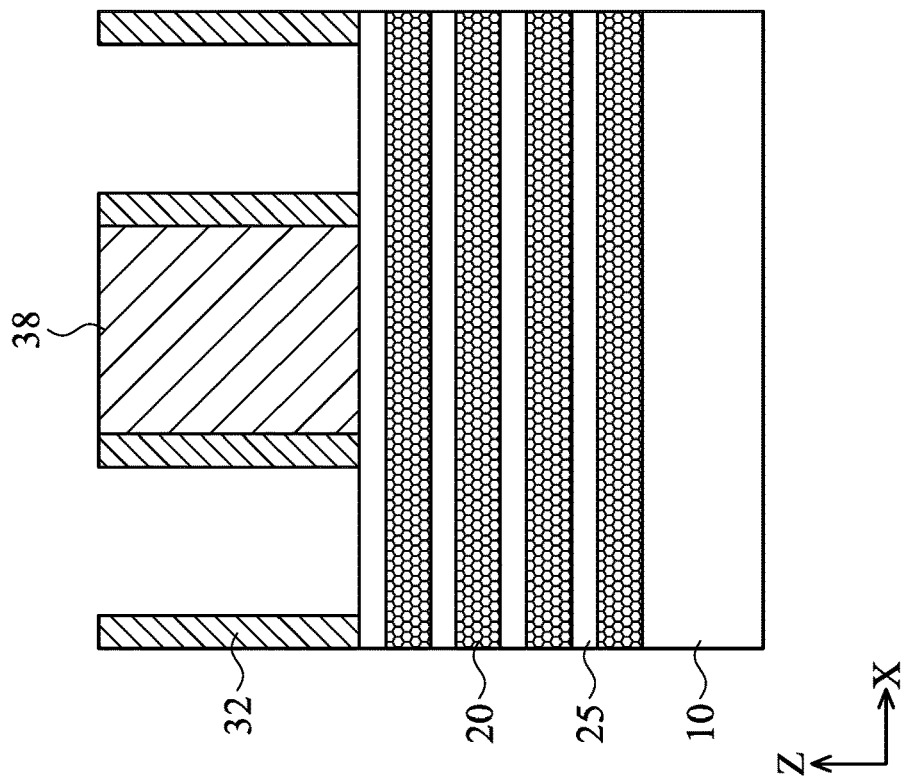
FIG. 8 shows one of the various stages of manufacturing a semiconductor FET device according to an embodiment of the present disclosure.

FIG. 8 shows a cross sectional view along the X direction after the cover layer (sidewall spacers) 32 is formed. In FIG. 8 and thereafter, the upper portion and the detailed structure of the sacrificial gate structure 38 are not shown for simplicity. In FIGS. 8-11 and 15-18, only one GAA FET is illustrated, but two or more GAA FETs, which respectively have different source/drain configurations as shown in FIGS. 12A-13F and 21A-21D, may be fabricated on the same substrate 10.

Figure 9:
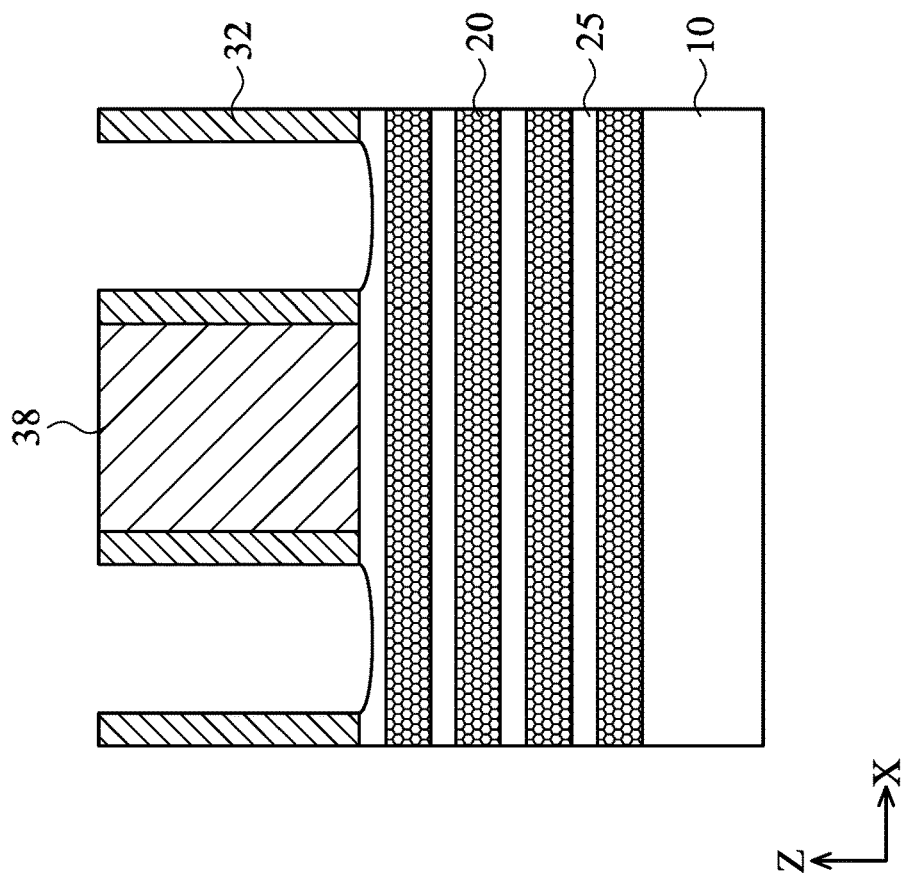
FIG. 9 shows one of the various stages of manufacturing a semiconductor FET device according to an embodiment of the present disclosure.

Next, as shown in FIG. 9, bottom portions of the cover layer 32 are removed by anisotropic etching, thereby forming sidewall spacers 32. In some embodiments, an upper portion of an uppermost second semiconductor layer 25 is slightly etched. In other embodiments, the uppermost semiconductor layer 25 is not substantially etched.

Figure 10:
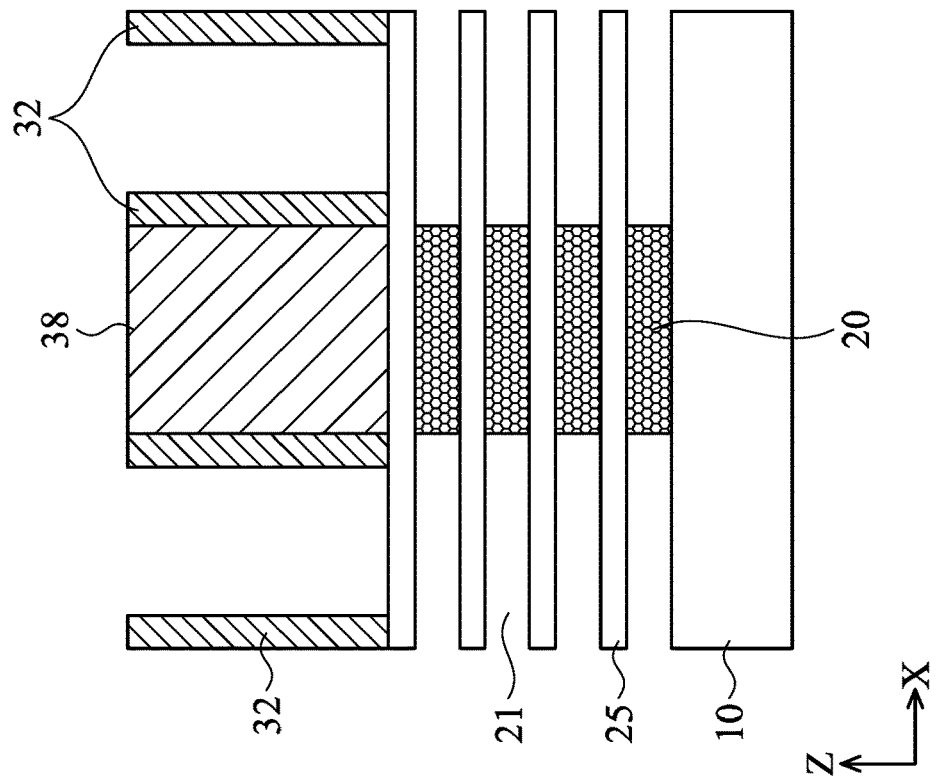
FIG. 10 shows one of the various stages of manufacturing a semiconductor FET device according to an embodiment of the present disclosure.
Figure 13B:
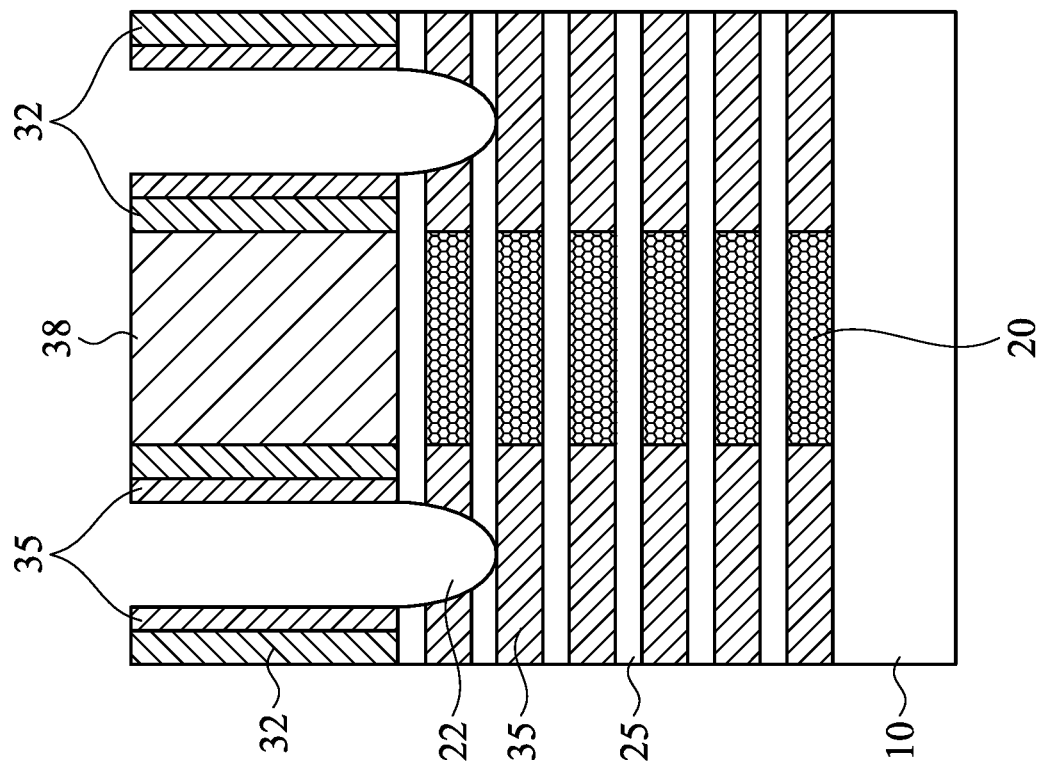
Figure 13A:
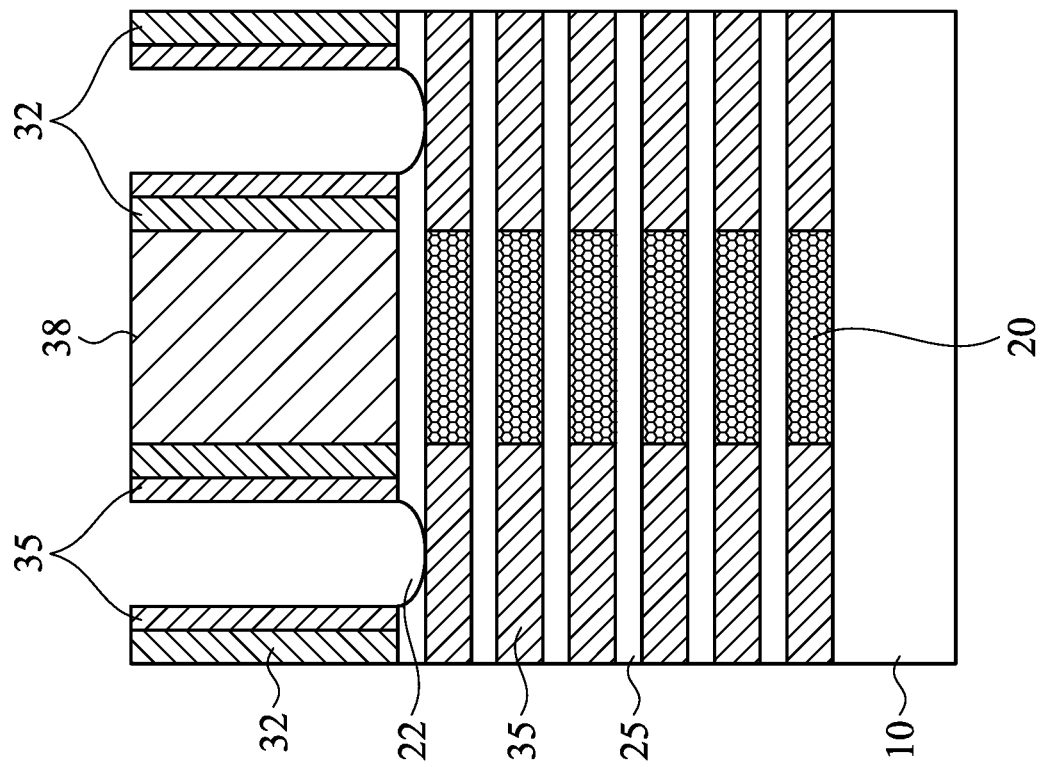
Figure 13F:
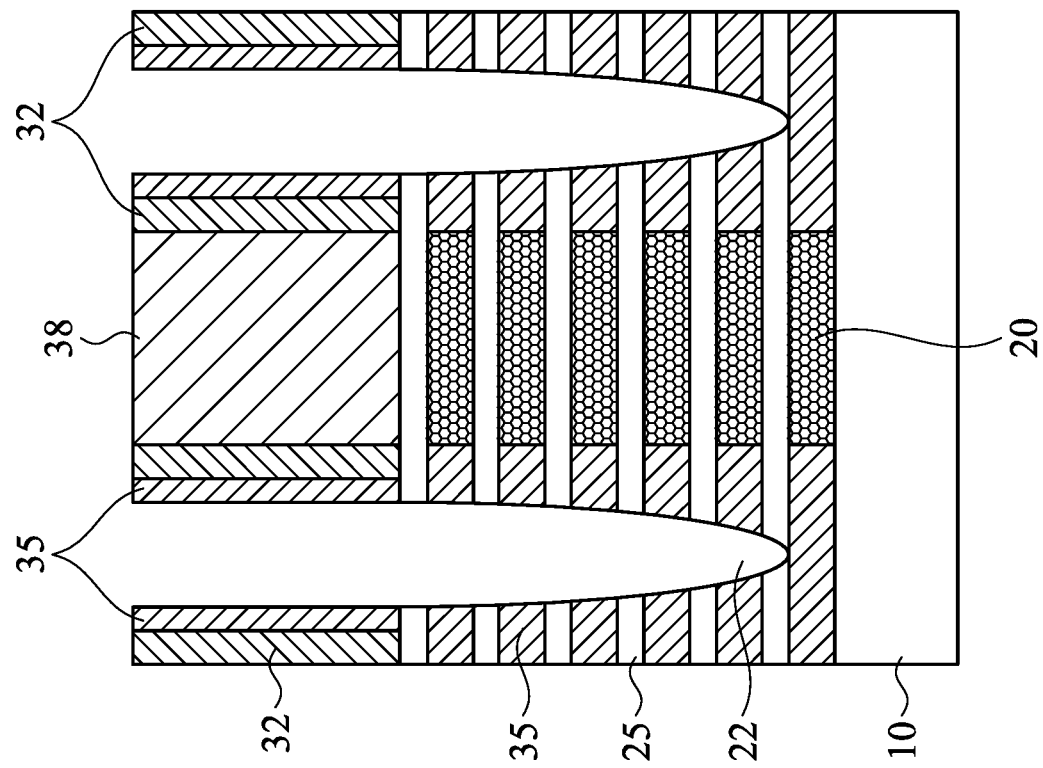
Figure 13E:
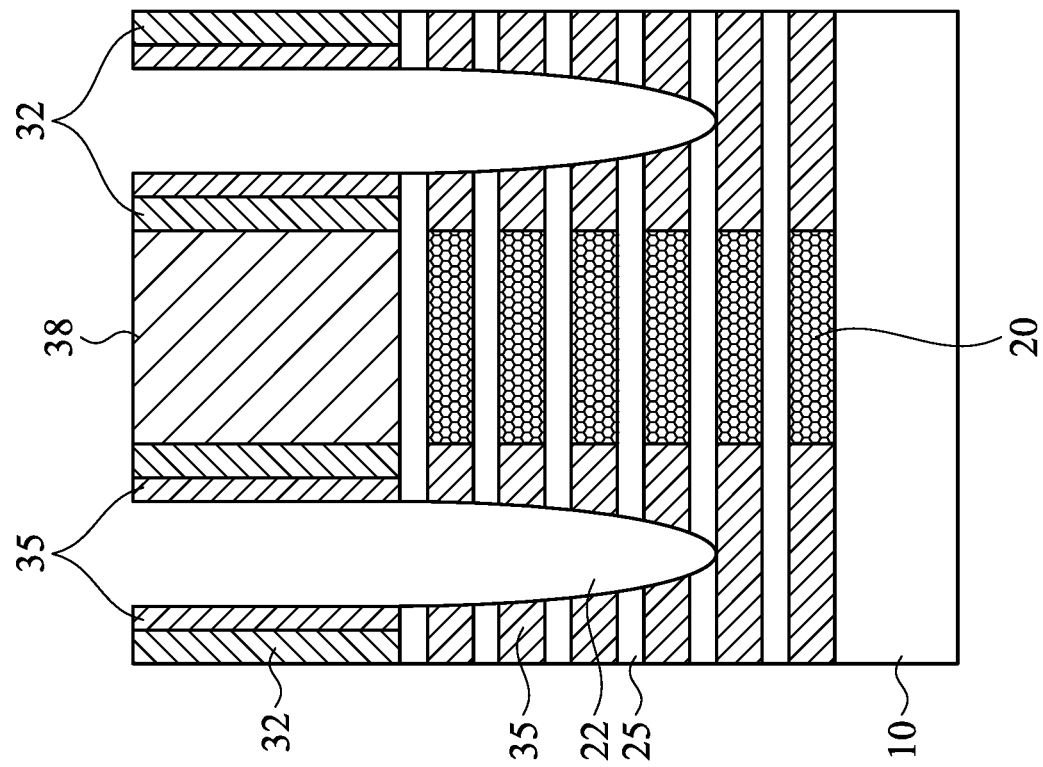

Subsequently, as shown in FIG. 10, the first semiconductor layers 20 in the source/drain region are removed by using one or more lithography and etching operations, thereby forming a first S/D space 21. In some embodiments, the substrate 10 (or the bottom part of the fin structures 11) is also partially etched. Further, in some embodiments, the first semiconductor layers 20 are laterally etched in the X direction. The amount of etching of the first semiconductor layer 20 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

Figure 11:
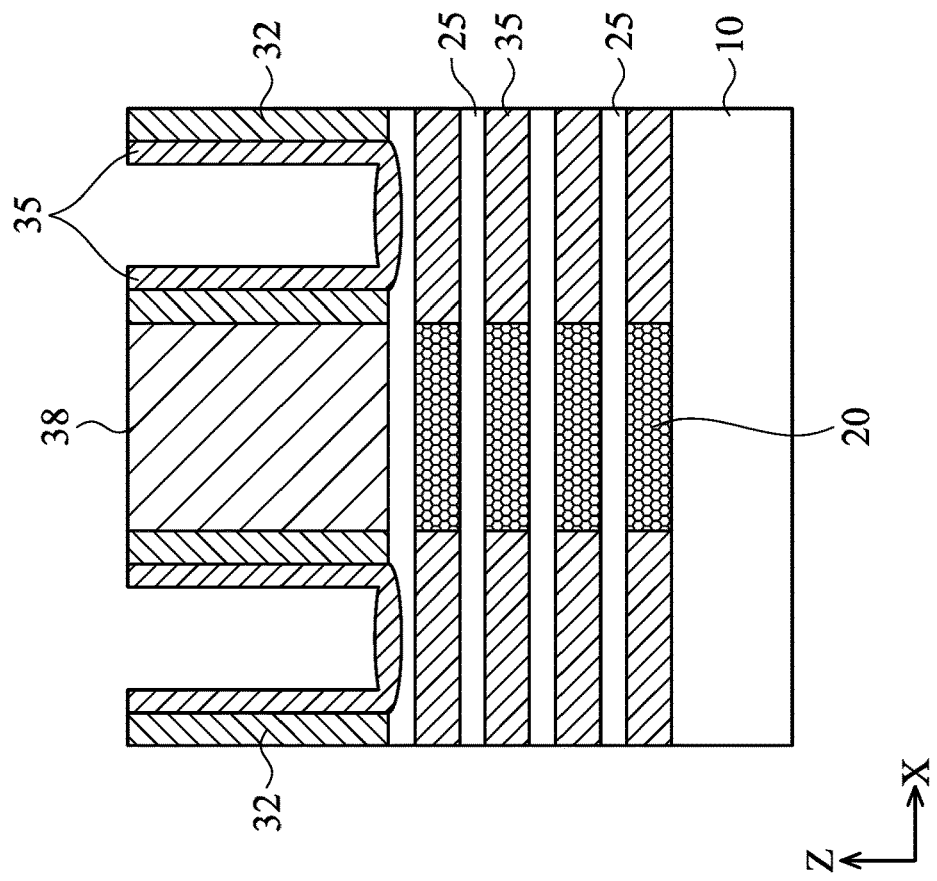
FIG. 11 shows one of the various stages of manufacturing a semiconductor FET device according to an embodiment of the present disclosure.

Then, as shown in FIG. 11, a dielectric layer 35 is formed on the lateral ends of the first semiconductor layer 20 and on the second semiconductor layer 25 in the first S/D space 21. The dielectric layer 35 is made of suitable dielectric materials such as silicon oxide, silicon oxynitride, fluorine-doped silicate glass (FSG), low-k dielectrics such as carbon doped oxides (SiOC, SiOCN), extremely low-k dielectrics such as porous carbon doped silicon dioxide, a polymer such as polyimide, combinations of these, or the like. In some embodiments, the dielectric layer 35 includes one or more layers of low-k dielectric material. The dielectric layer 35 is formed so as to fully fill the first S/D space 21 and also formed on sidewall spacers 32, in some embodiments. The dielectric layer 35 can be formed through a process such as CVD, flowable CVD (FCVD), ALD, or a spin-on-glass process, although any acceptable process may be utilized.

In some embodiments, before forming the dielectric layer 35, an insulating layer is conformally formed on the lateral ends of the first semiconductor layer 20 and on the second semiconductor layer 25. The insulating layer functions as an etch-stop layer in the subsequent channel formation operations. The insulating layer includes one of silicon nitride (SiN) and silicon oxide (SiO$_2$), and has a thickness in a range from about 0.5 nm to about 3.0 nm. In other embodiments, the insulating layer has a thickness in a range from about 1.0 nm to about 2.0 nm. The insulating layer can be formed by ALD or any other suitable method.

After the dielectric layer 35 is formed, the source/drain region is etched to form a second S/D space 22, as shown in FIGS. 12A-12D. Depending on the desired drive current (or resistance), the depth of the second S/D space 22 and the thickness of the isolation insulating layer 15 are adjusted. For example, in the case of FIG. 12A, the dielectric layer 35 and only the uppermost second semiconductor layer 25 are etched, while the remaining second semiconductor layers 25 remain embedded in the dielectric layer 35. The upper surface of the isolation insulating layer 15 is located below the bottom of the S/D space 22. In some embodiments, the upper surface of the isolation insulating layer 15 is located above the second semiconductor wire 25 just below the bottom of the S/D space 22. In other embodiments, the upper surface of the isolation insulating layer 15 is located above the second semiconductor wire 25 second below the bottom of the S/D space 22. In the case of FIG. 12B, two upper second semiconductor layers 25 and the dielectric layer 35 are etched to expose end portions of the two upper second semiconductor layers 25 in the second S/D space 22. The upper surface of the isolation insulating layer 15 is located below the bottom of the S/D space 22. In some embodiments, the upper surface of the isolation insulating layer 15 is located above the second semiconductor wire 25 just below the bottom of the S/D space 22. In other embodiments, the upper surface of the isolation insulating layer 15 is located above the second semiconductor wire 25 second below the bottom of the S/D space 22. Similarly, in the case of FIG. 12C, three second semiconductor layers 25 from the top and the dielectric layer 35 are etched to expose end portions of the three second semiconductor layers 25 in the second S/D space 22. The upper surface of the isolation insulating layer 15 is located below the bottom of the S/D space 22. In some embodiments, the upper surface of the isolation insulating layer 15 is located above the second semiconductor wire 25 just below the bottom of the S/D space 22. In other embodiments, the upper surface of the isolation insulating layer 15 is located above the substrate 10. In the case of FIG. 12D, the dielectric layer 35 and the second semiconductor layers 25 are etched so that end portions of all of the second semiconductor layers 25 are exposed in the second S/D space 22. The upper surface of the isolation insulating layer 15 is located below the bottom of the S/D space 22. In some embodiments, the upper surface of the isolation insulating layer 15 is located above the substrate 10. In some embodiments, all of the structures shown in FIGS. 12A-12D are provided on the same substrate 10 (on one semiconductor chip). In other embodiments, only some of the structures shown in FIGS. 12A-12D are provided on the same substrate 10. The structures of FIGS. 12A-12D can be formed by one or more lithography and etching operations.

FIGS. 13A-13F show the structures after the second S/D spaces 22 are formed in devices having vertically arranged six second semiconductor layers 25. In some embodiments, all of the structures shown in FIGS. 13A-13F are provided on the same substrate 10, and in other embodiments, only some of the structures shown in FIGS. 13A-13F are provided on the same substrate 10. The structures of FIGS. 13A-13F can be formed by one or more lithography and etching operations.

FIG. 14 shows the one or more lithography and etching operations to fabricate the structures shown in FIGS. 13A-13F on the same substrate, according to some embodiments. To fabricate all of the structures shown in FIGS. 13A-13F, at most three lithography/etching operations can be performed. For example, the first, third and fifth S/D regions for a one-wire contact structure, a three-wire contact structure and a five-wire contact structure, respectively, are subjected to a first etching operation to a depth of D, which corresponds to an etching depth to cut and expose ends of the uppermost second semiconductor layer 25, but not reach the next second semiconductor layer 25. The second, fourth and sixth S/D regions for a two-wire contact structure, a four-wire contact structure and a six-wire contact structure, respectively, are covered by, for example, photoresist formed by a lithography operation. Then, the second, third and sixth S/D regions are subjected to a second etching operation to a depth of 2D, while the first, fourth and fifth S/D regions are covered. Further, the fourth, fifth and sixth S/D regions are subjected to a third etching operation to a depth of 3D, while the first, second and third S/D regions are covered. The order of the first to third etching operations can be any order.

The number of lithography/etching operations varies depending on the number of second semiconductor layers 25. When the number of the second semiconductor layer 25 is 1 to 3, the number of lithography/etching operations can be 2 (depth D and 2D etching operations), when the number of the second semiconductor layer 25 is 4 to 7, the number of lithography/etching operations can be 3 (depth D, 2D and 4D etching operations), and when the number of the second semiconductor layer 25 is 8 to 13, the number of lithography/etching operations can be 4 (depth D, 2D, 4D and 6D etching operations).

Figure 15:
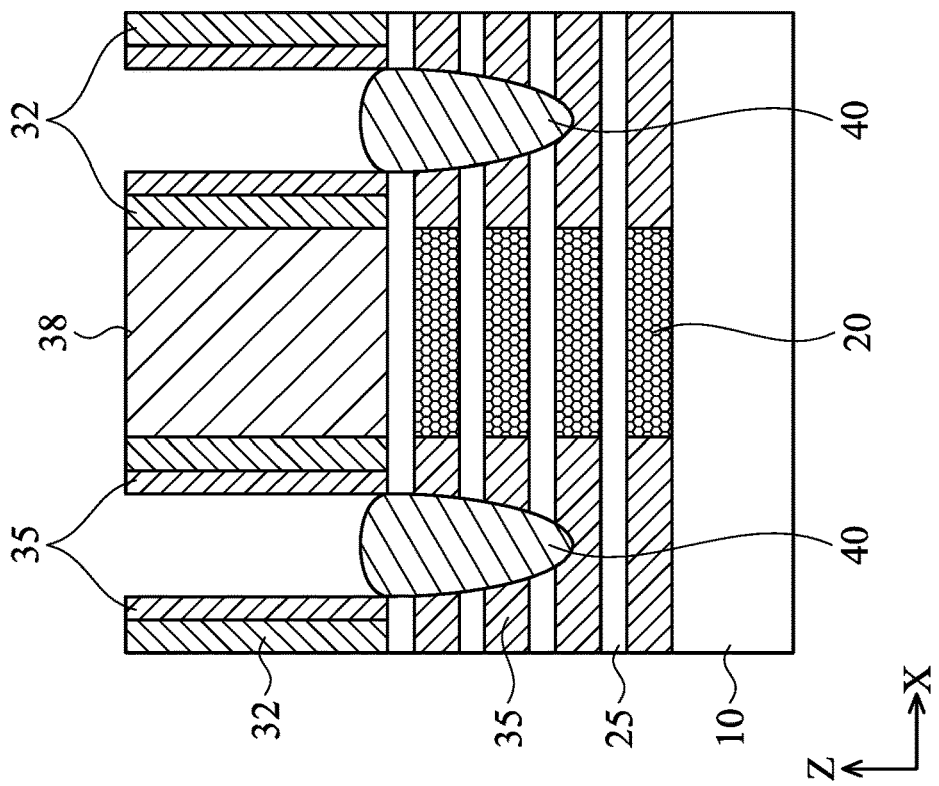
FIG. 15 shows one of the various stages of manufacturing a semiconductor FET device according to an embodiment of the present disclosure.

After the second S/D space 22 is formed, a source/drain epitaxial layer 40 is formed, as shown in FIG. 15. In the following figures, the manufacturing operations after the structure shown in FIG. 12C (three-wire contact case) is formed are explained. However, the same operations can be applied to the structures shown in FIGS. 12A, 12B, 12D and 13A-13F.

The source/drain epitaxial layer 40 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layer 40 is formed by an epitaxial growth method using CVD, ALD or molecular beam epitaxy (MBE). As shown in FIG. 15, the source/drain epitaxial layer 40 is formed in contact with the second semiconductor layers 25.

Figure 16:
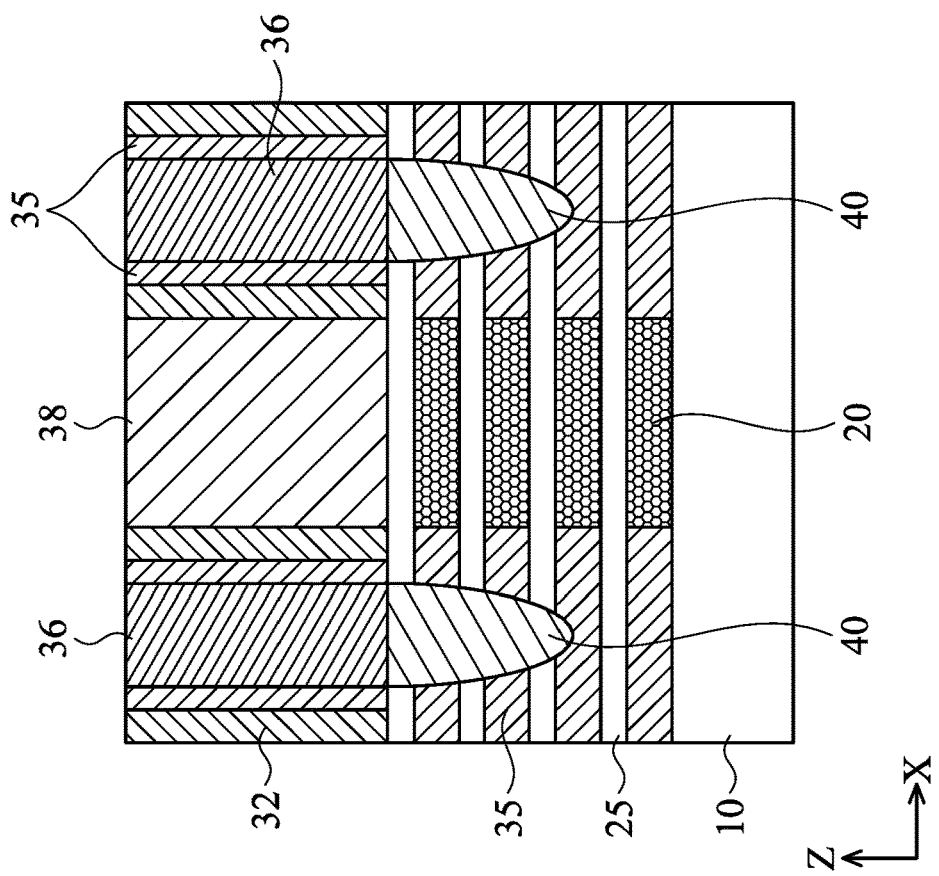
FIG. 16 shows one of the various stages of manufacturing a semiconductor FET device according to an embodiment of the present disclosure.

Then, as shown in FIG. 16, an interlayer dielectric (ILD) layer 36 is formed over the S/D epitaxial layer 40. The materials for the ILD layer 36 include compounds comprising Si, O, C and/or H, such as silicon oxide, SiCOH and SiOC. Organic materials, such as polymers, may be used for the ILD layer 36. After the ILD layer 36 is formed, a planarization operation, such as CMP, is performed, so that the top portion of the sacrificial gate electrode layer 30 is exposed.

Figure 17:
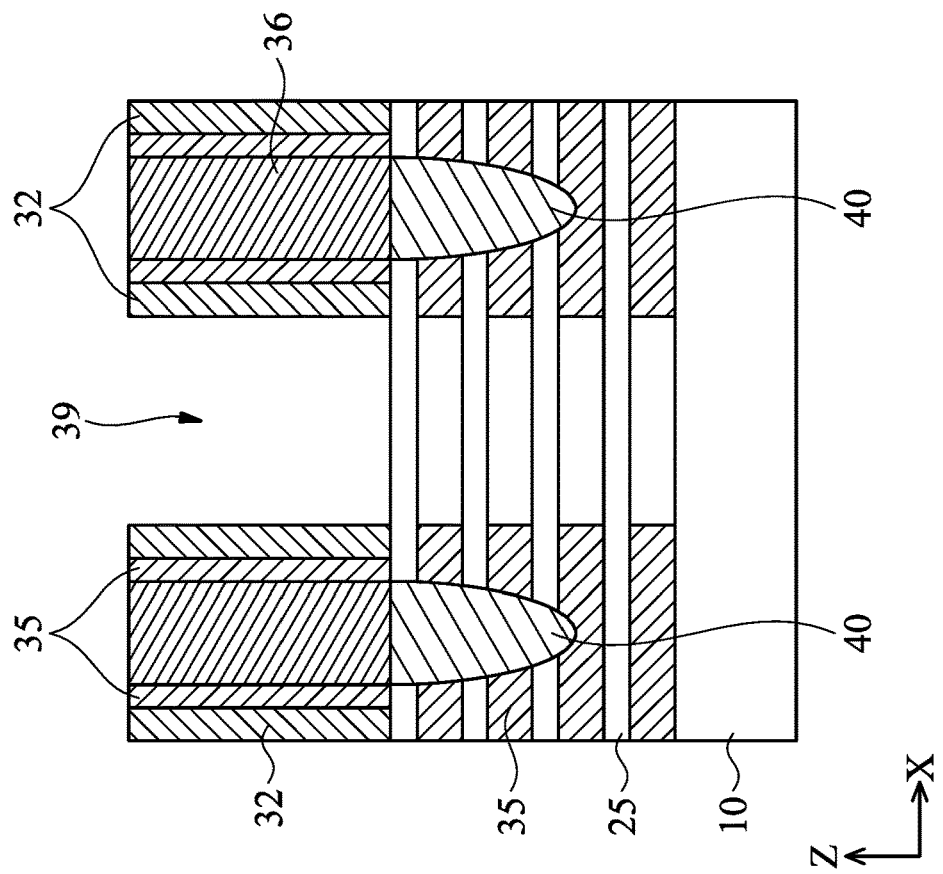
FIG. 17 shows one of the various stages of manufacturing a semiconductor FET device according to an embodiment of the present disclosure.

Then, the sacrificial gate structure 38 including the sacrificial electrode layer 30 and sacrificial gate dielectric layer 31 are removed, thereby forming a gate space 39, as shown in FIG. 17. The ILD layer 36 protects the S/D epitaxial layer 40 during the removal of the sacrificial gate structures. The sacrificial gate structures can be removed using plasma dry etching and/or wet etching. When the sacrificial gate electrode layer 30 is polysilicon and the ILD layer 36 is silicon oxide, a wet etchant such as a TMAH solution can be used to selectively remove the sacrificial gate electrode layer 30. The sacrificial gate dielectric layer 31 is thereafter removed using plasma dry etching and/or wet etching.

Figure 18:
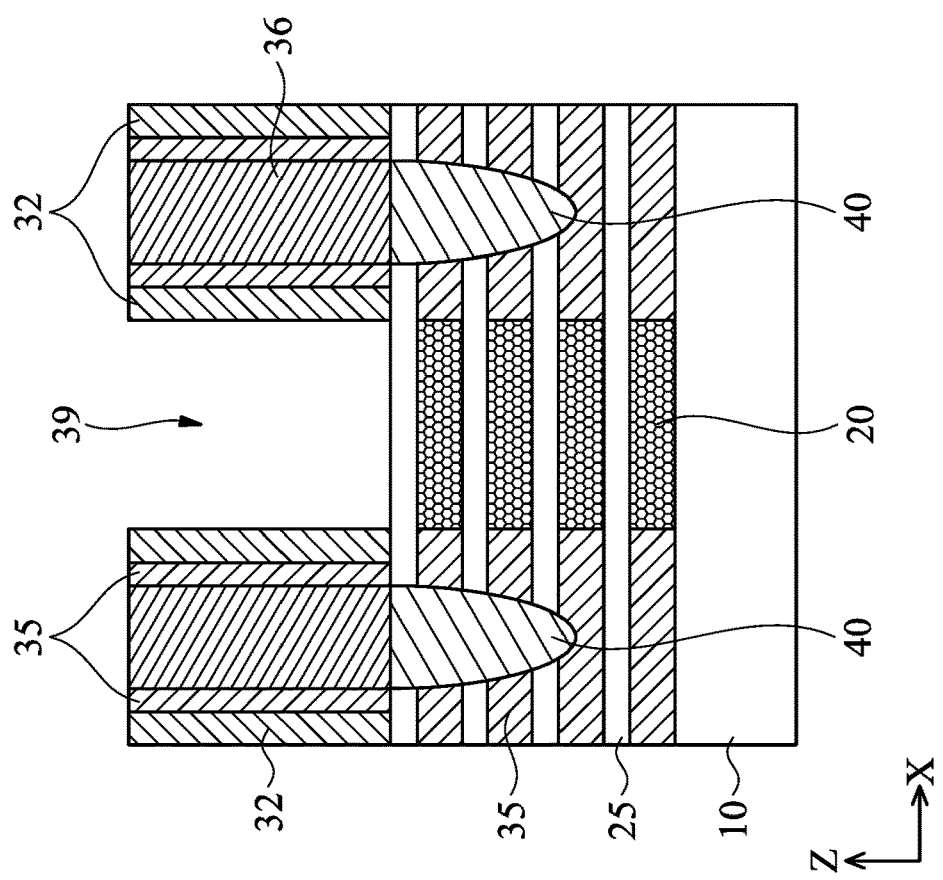
FIG. 18 shows one of the various stages of manufacturing a semiconductor FET device according to an embodiment of the present disclosure.

After the sacrificial gate structures are removed, the first semiconductor layers 20 are removed, thereby forming wires of the second semiconductor layers 25, as channel regions, as shown in FIG. 18. The first semiconductor layers 20 can be removed or etched using an etchant that can selectively etch the first semiconductor layers 20 against the second semiconductor layers 25, as set forth above. In some embodiments, when the insulating layer is formed before the dielectric layer 35 is formed, the etching of the first semiconductor layers 20 stops at the insulating layer.

Figure 19:
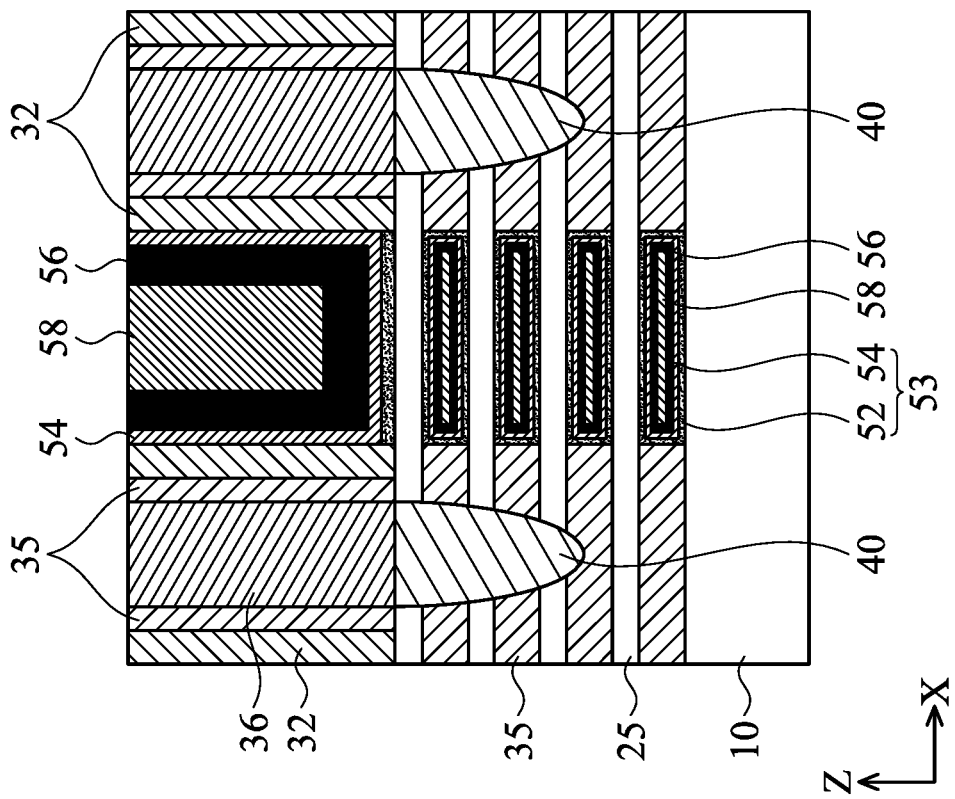
FIG. 19 shows one of the various stages of manufacturing a semiconductor FET device according to an embodiment of the present disclosure.
Figure 21A:
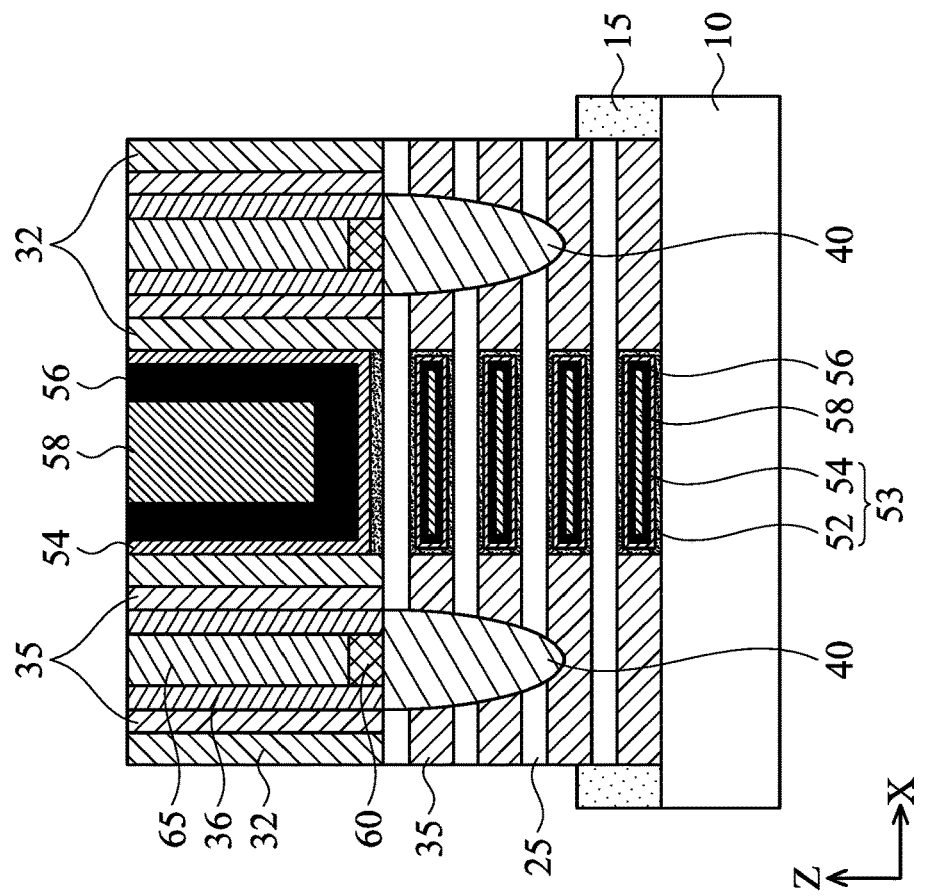
Figure 21B:
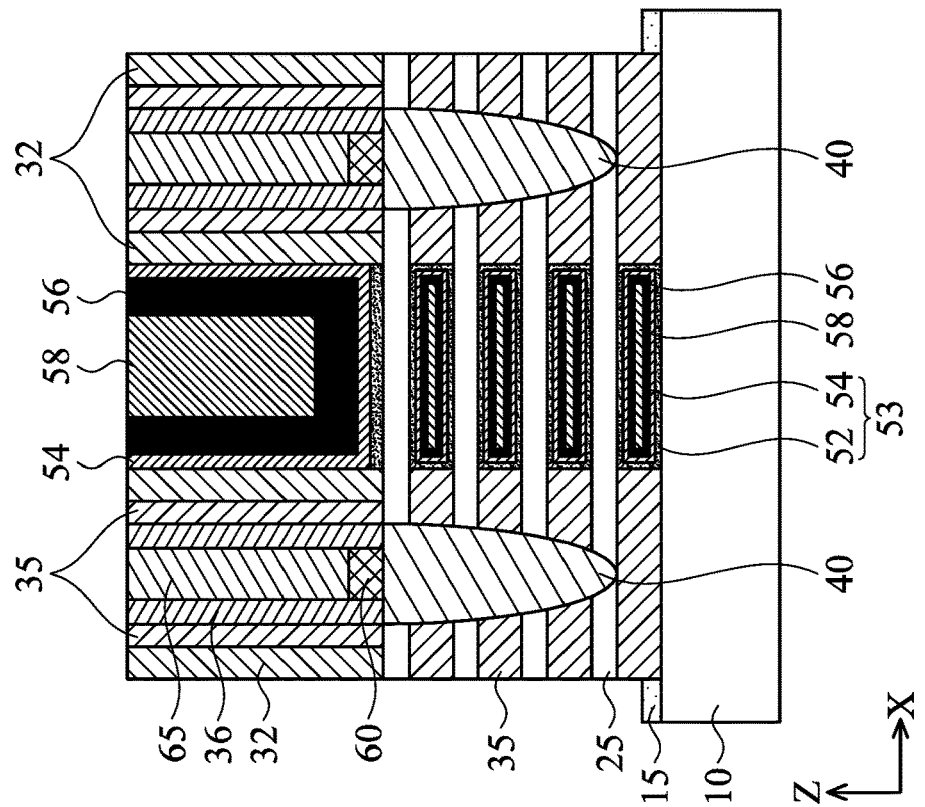

After the semiconductor wires of the second semiconductor layers 25 are formed, a gate dielectric layer 53 is formed around each channel layers (wires of the second semiconductor layers 25), and a gate electrode layer 58 is formed on the gate dielectric layer 53, as shown in FIG. 19.

In some embodiments, the gate dielectric layer 53 includes an interfacial layer 52 and a high-k dielectric layer 54. The interfacial layer 52 is a chemically formed silicon oxide in some embodiments. In certain embodiments, the high-k gate dielectric layer 54 includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The high-k gate dielectric layer 54 can be formed by CVD, ALD or any suitable method. In one embodiment, the high-k gate dielectric layer 54 is formed using a highly conformal deposition process such as ALD in order to ensure the formation of a gate dielectric layer having a uniform thickness around each channel layers. The thickness of the high-k gate dielectric layer 54 is in a range from about 1 nm to about 6 nm in one embodiment.

The gate electrode layer 58 is formed on the gate dielectric layer 53 to surround each channel layer. The gate electrode layer 58 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 58 may be formed by CVD, ALD, electro-plating, or other suitable method. The gate electrode layer is also deposited over the upper surface of the ILD layer 36. The gate dielectric layer and the gate electrode layer formed over the ILD layer 36 are then planarized by using, for example, CMP, until the top surface of the ILD layer 36 is revealed. In some embodiments, after the planarization operation, the gate electrode layer 58 is recessed and a cap insulating layer (not shown) is formed over the recessed gate electrode layer 58. The cap insulating layer includes one or more layers of a silicon nitride-based material, such as SiN. The cap insulating layer can be formed by depositing an insulating material followed by a planarization operation.

In certain embodiments, one or more work function adjustment layers 56 are interposed between the gate dielectric layer 53 and the gate electrode layer 58. The work function adjustment layers 56 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer 56 may be formed by ALD, PVD, CVD, e-beam evaporation, or other suitable process. Further, the work function adjustment layer 56 may be formed separately for the n-channel FET and the p-channel FET which may use different metal layers.

Figure 20:
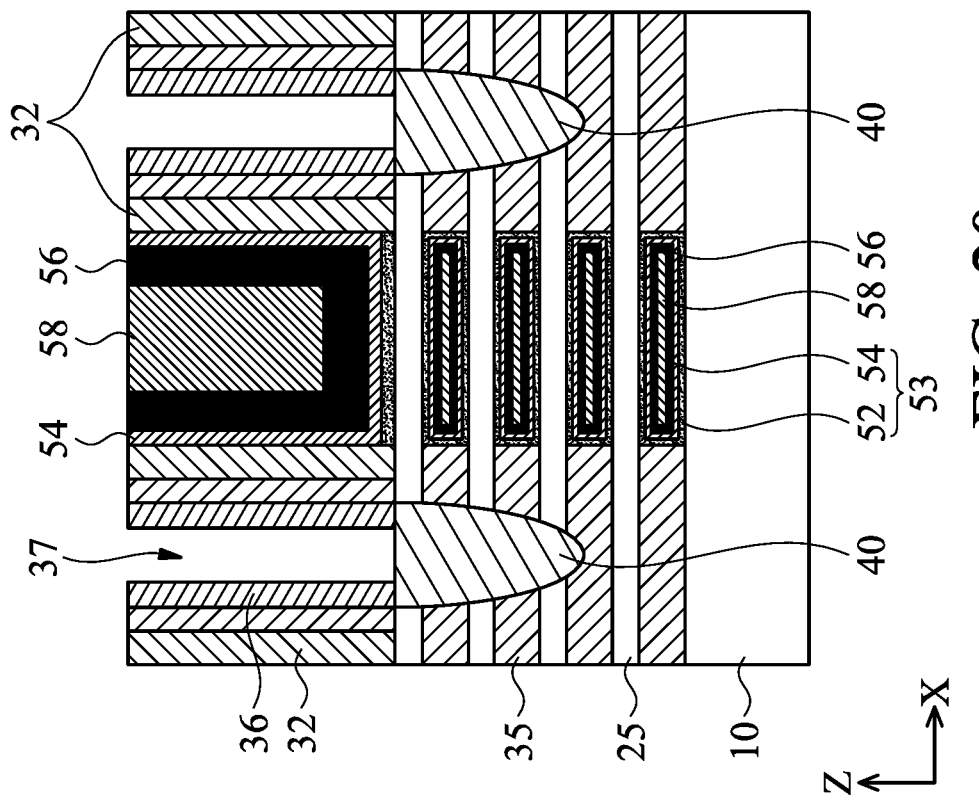
FIG. 20 shows one of the various stages of manufacturing a semiconductor FET device according to an embodiment of the present disclosure.

Subsequently, contact holes 37 are formed in the ILD layer 36 by using dry etching, thereby exposing the upper portion of the S/D epitaxial layer 40, as shown in FIG. 20. In some embodiments, a silicide layer is formed over the S/D epitaxial layer 40. The silicide layer includes one or more of WSi, CoSi, NiSi, TiSi, MoSi and TaSi. Then, a conductive contact layer 60 is formed in the contact holes, and then a conductive contact plug 65 is formed on the conductive contact layer 60, as shown in FIGS. 21A-21D. FIGS. 21A, 21B, 21C and 21D correspond to FIGS. 12D, 12C, 12B and 12A, respectively. The upper surface of the isolation insulating layer 15 is located below the bottom of the S/D epitaxial layer 40. In some embodiments, the upper surface of the isolation insulating layer 15 is located above the second semiconductor wire 25 just below the bottom of the S/D epitaxial layer 40, above the second semiconductor wire 25 second below the bottom of the S/D epitaxial layer 40, or the upper surface of the substrate 10.

The conductive contact layer 60 includes one or more of Co, Ni, W, Ti, Ta, Cu, Al, TiN and TaN formed by ALD, PVD, CVD, e-beam evaporation, or other suitable process. The conductive contact plug 65 includes one or more layers of Co, Ni, W, Ti, Ta, Cu, Al, TiN and TaN formed by ALD, PVD, CVD, e-beam evaporation, or other suitable process.

It is understood that the GAA FETs undergoes further CMOS processes to form various features such as contacts/vias, interconnect metal layers, dielectric layers, passivation layers, etc.

Figure 22:
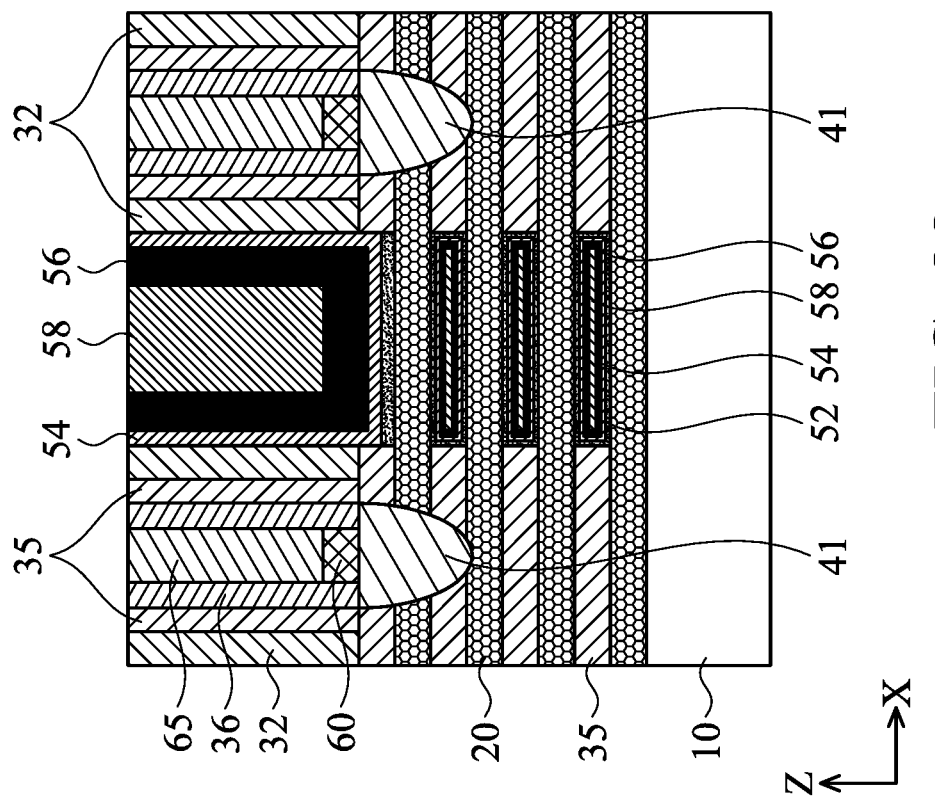
FIG. 22 shows a cross sectional view of a semiconductor FET device according to another embodiment of the present disclosure.

FIG. 22 shows a cross sectional view of a semiconductor FET device according to another embodiment of the present disclosure. Material, configuration, dimensions and/or processes the same as or similar to the foregoing embodiments described with respect to FIGS. 1-21D may be employed in the embodiment of FIG. 22, and detailed explanation thereof may be omitted.

In the embodiment of FIG. 22, the first semiconductor layers 20 are utilized as channel regions (semiconductor wires). In one embodiment, the structure of FIG. 22 is a p-type GAA FET. In some embodiments, the first semiconductor layers 20 are made of $Si_{1-x}Ge_x$, where $0<x<1.0$. In certain embodiments, $0.3<x<0.8$. The source/drain epitaxial layer 41 includes one or more layers of Si, SiGe and Ge. Although FIG. 22 shows the structure of a two-wire contact case, the number of semiconductor wires 20 connected to the source/drain epitaxial layer 41 is not limited to two. Where the first semiconductor layers 20 are utilized as channel regions, substantially the same manufacturing operations as set forth above can be applied.

FIGS. 23-25F show various stages of manufacturing a semiconductor FET device according to another embodiment of the present disclosure. It is understood that additional operations can be provided before, during, and after processes shown by FIGS. 23-25F, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-22 may be employed in the embodiment of FIGS. 23A-25F, and detailed explanation thereof may be omitted.

Figure 23:
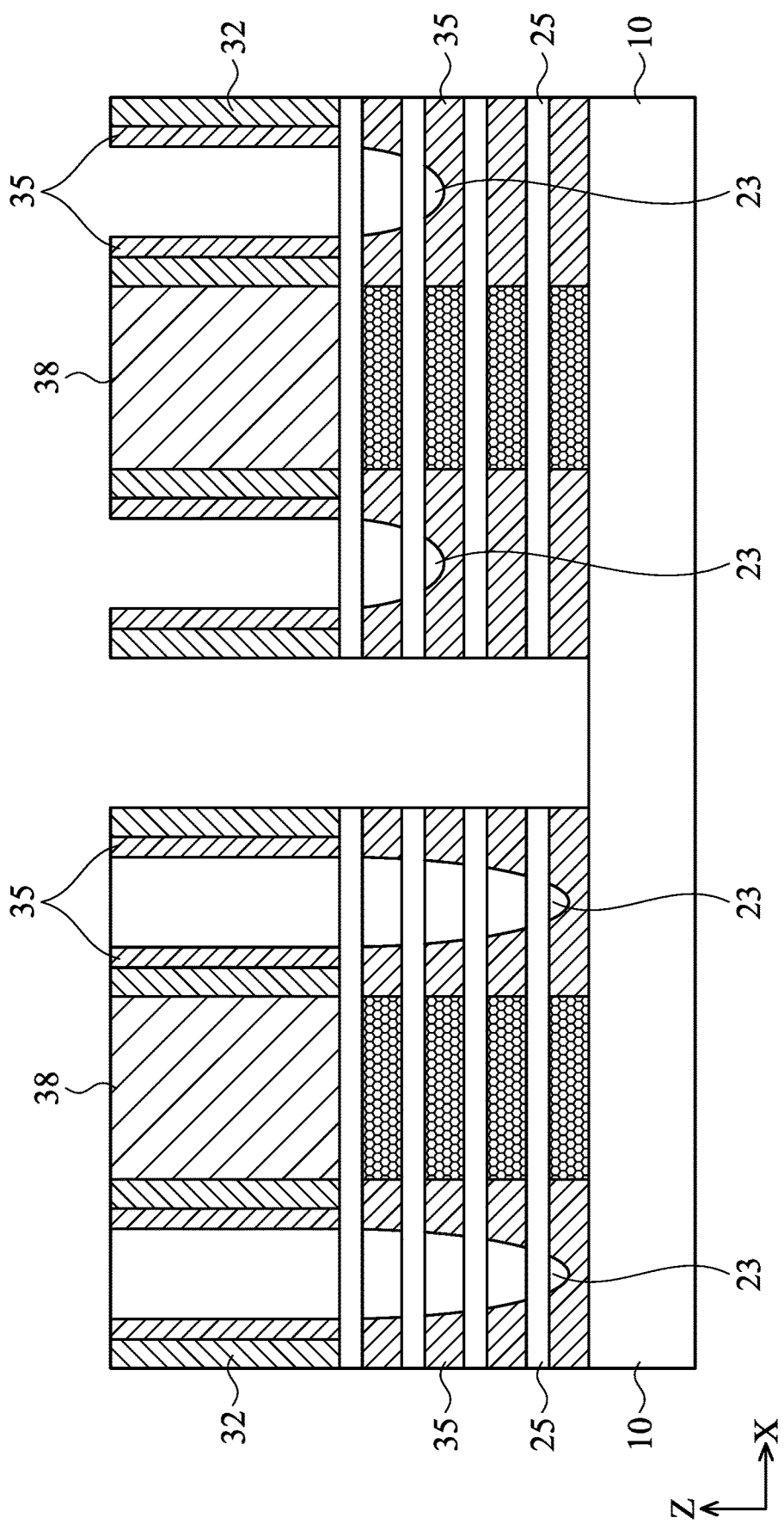
FIG. 23 shows one of the various stages of manufacturing a semiconductor FET device according to another embodiment of the present disclosure.
Figure 24:
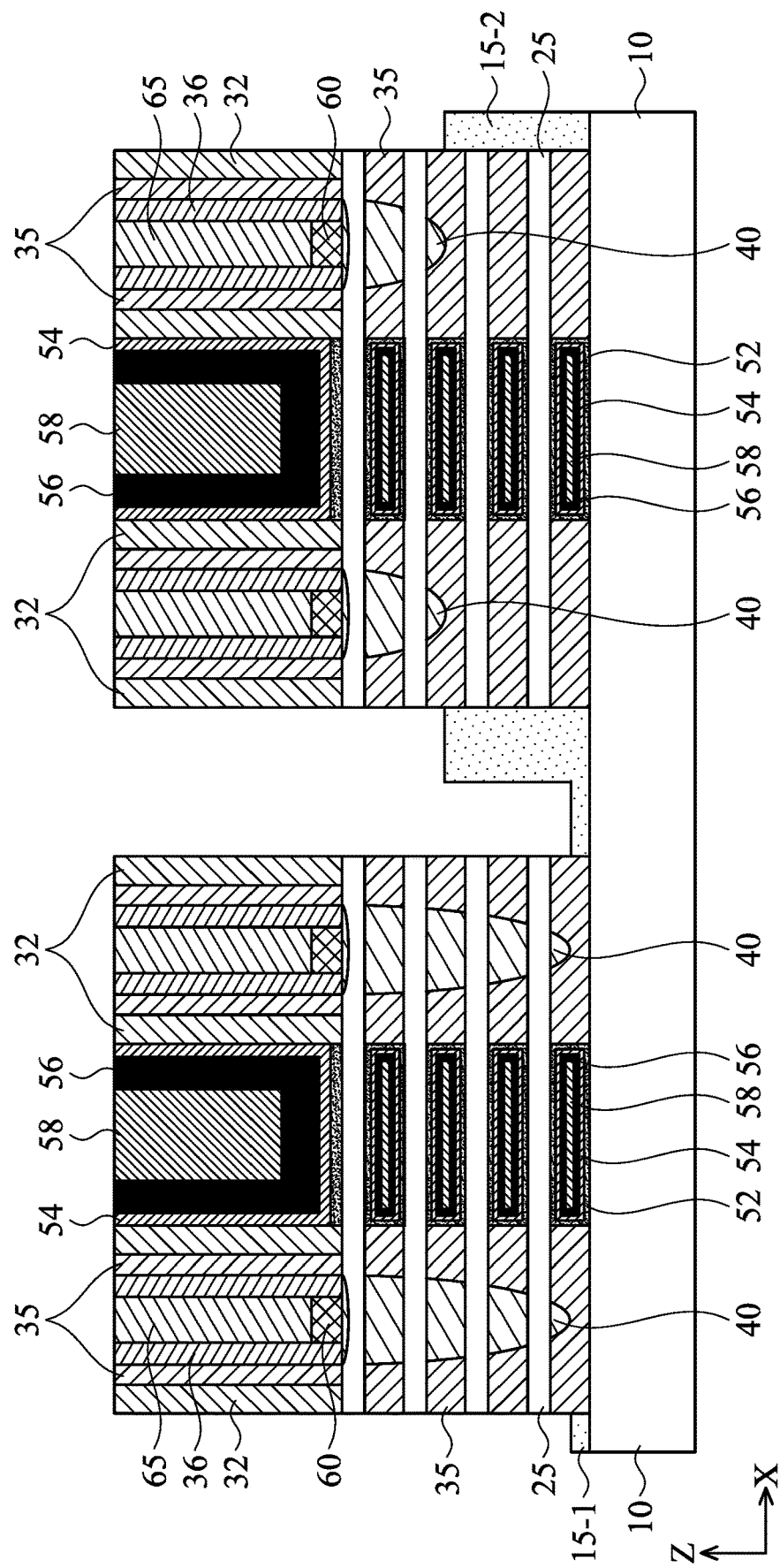
FIG. 24 shows one of the various stages of manufacturing a semiconductor FET device according to another embodiment of the present disclosure.
Figure 25A:
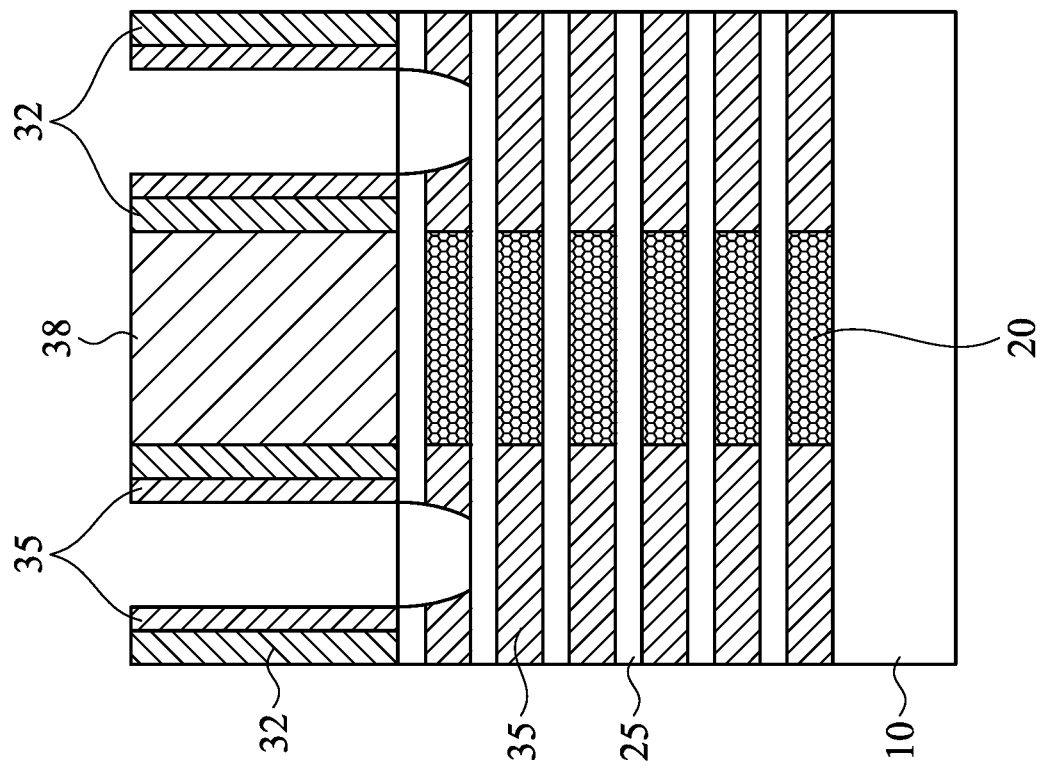
FIGS. 25A, 25B, 25C, 25D, 25E and 25F show one of the various stages of manufacturing a semiconductor FET device according to another embodiment of the present disclosure.
Figure 25B:
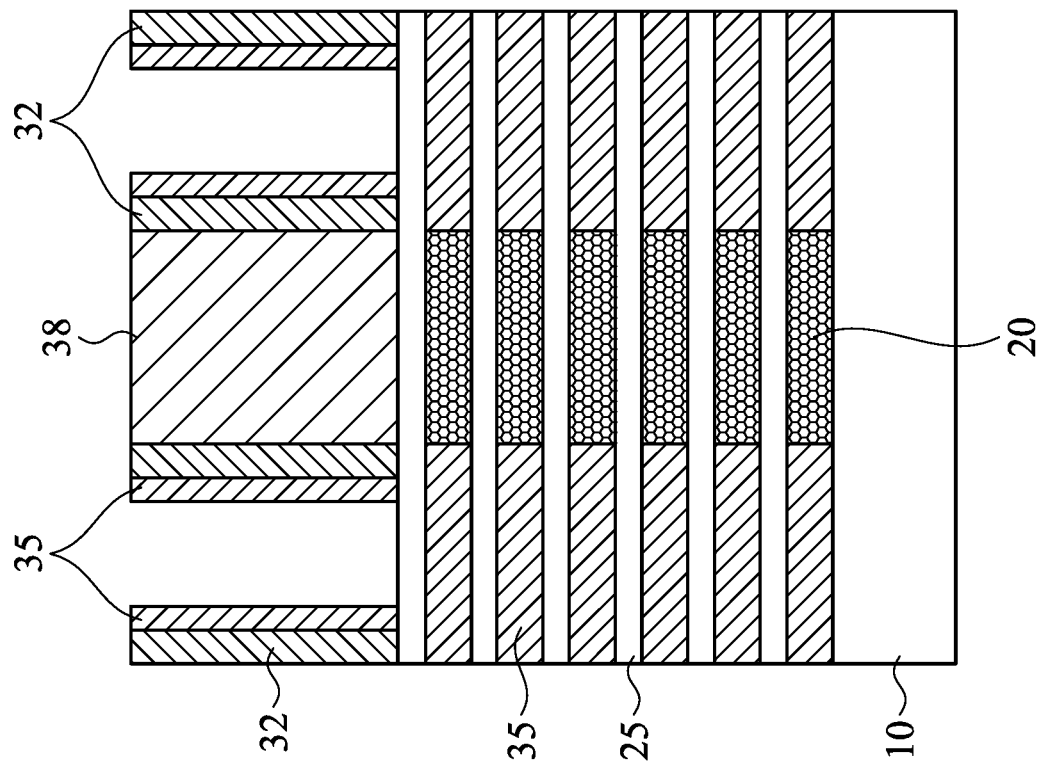
Figure 25C:
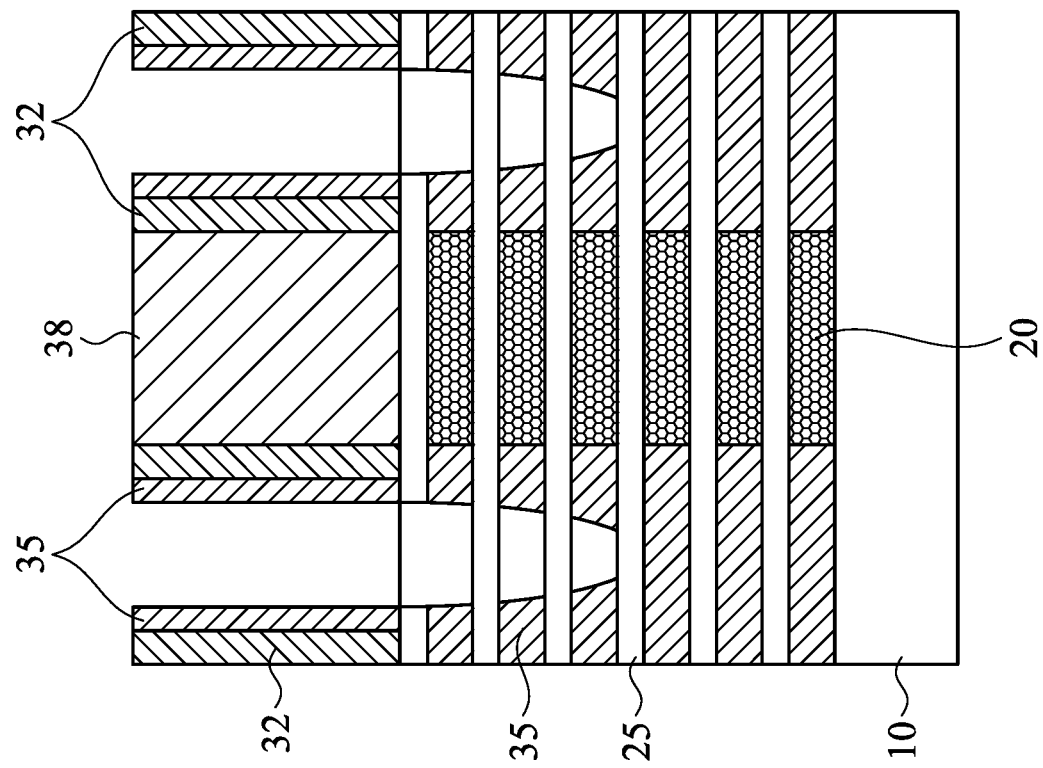
Figure 25D:
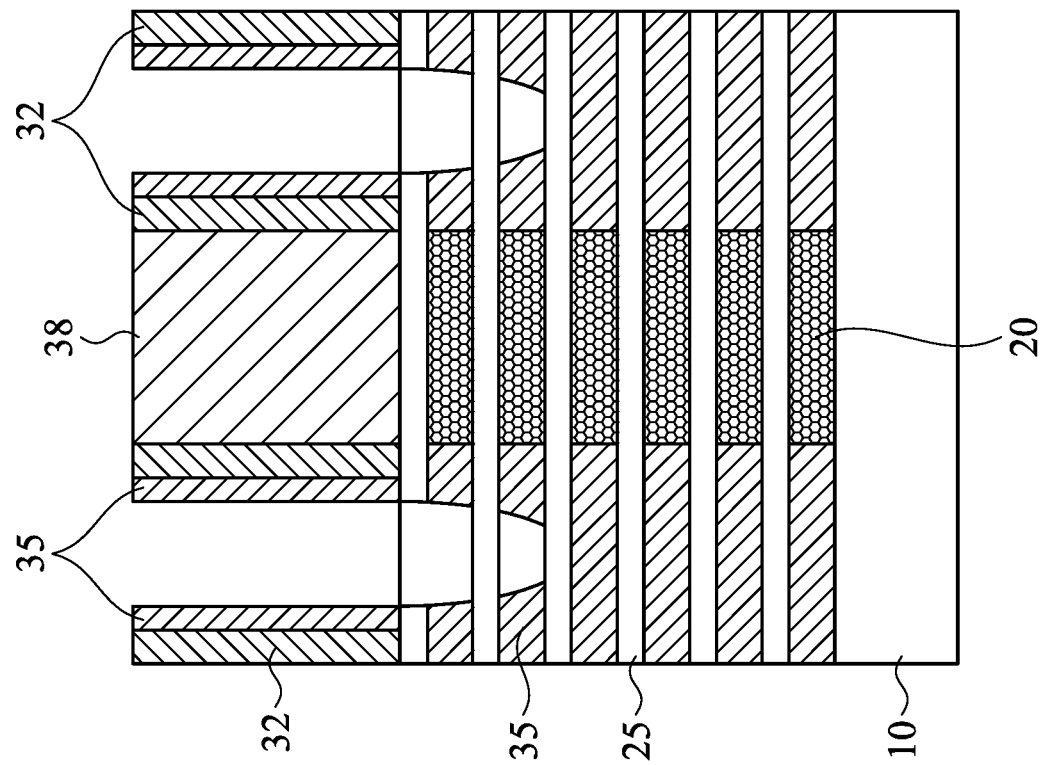
Figure 25F:
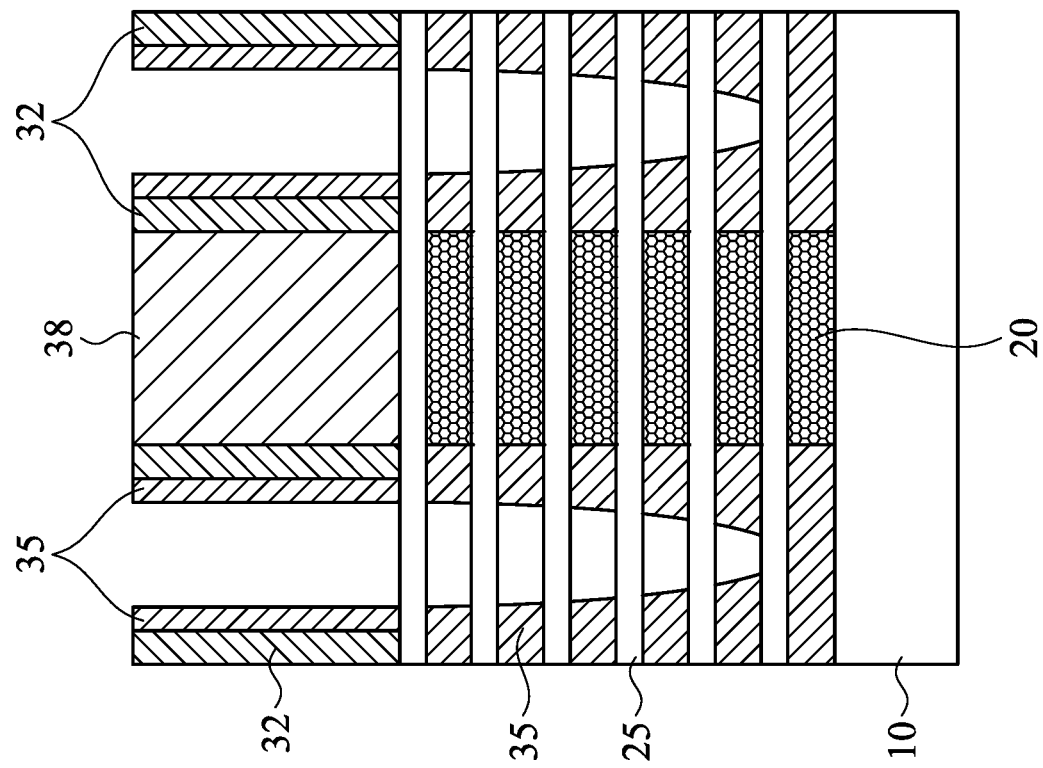
Figure 25E:
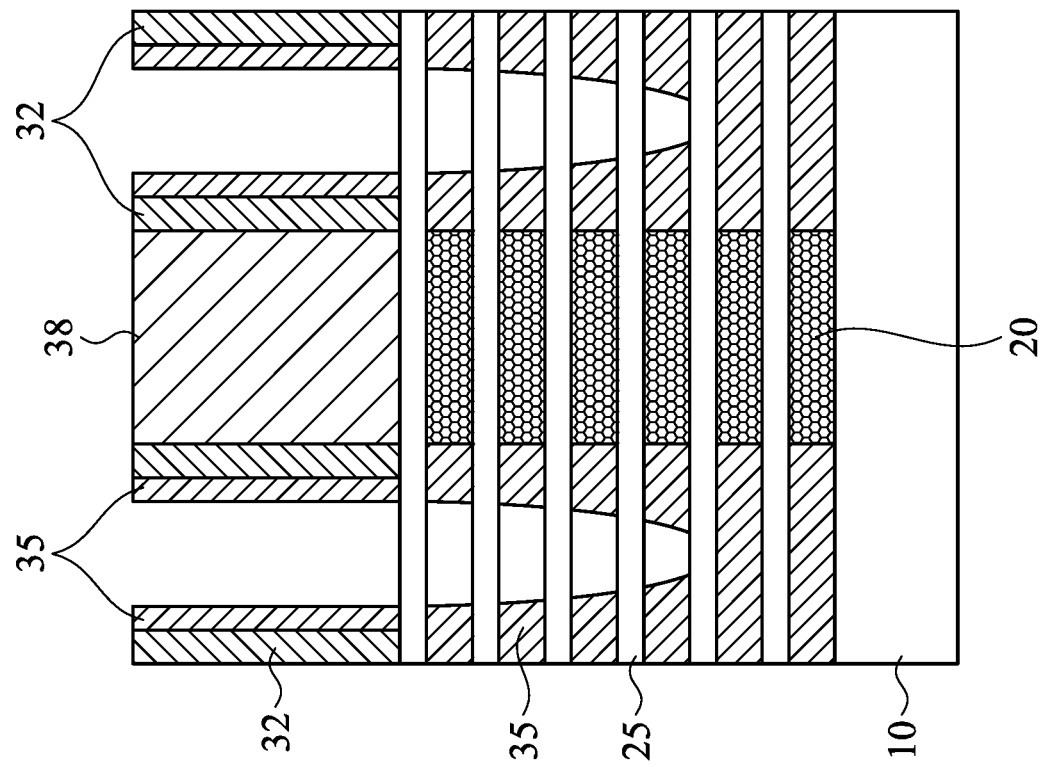

In the foregoing embodiments, when the second S/D space 22 is formed, one or more of the second semiconductor layers 25 are etched together with the dielectric layer 35. In this embodiment, the dielectric layer 35 is selectively etched, thereby exposing one or more of the second semiconductor layer 25 to cross the second S/D space 23, as show in FIG. 23. In FIG. 23, the four-wire contact structure and two-wire contact structure are formed on the same substrate 10. However, the embodiment is not limited to this configuration. Then, similar or the same operations explained with reference to FIGS. 15-21D are performed, and the structure shown in FIG. 24 can be obtained. FIGS. 25A-25D show the case that six second semiconductor layers 25 are employed.

Figure 26:
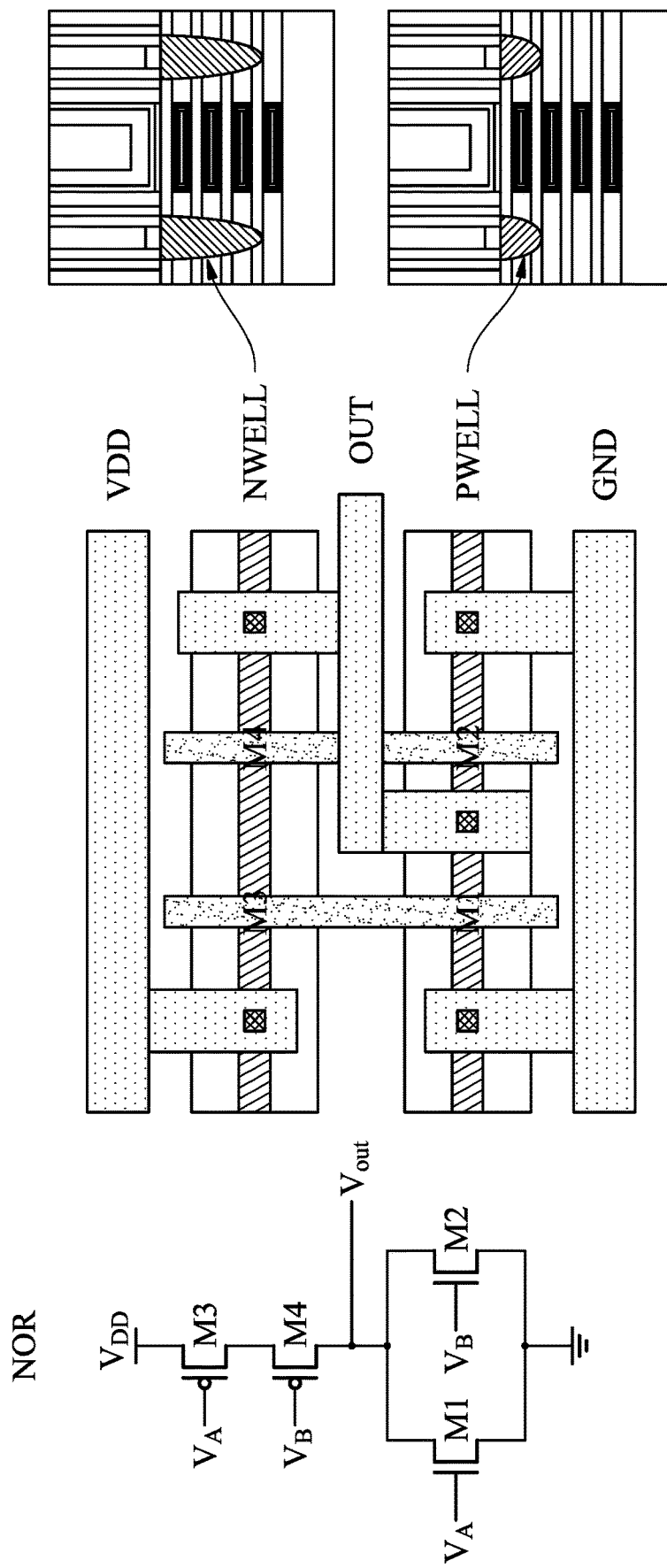
FIG. 26 shows a NOR circuit using semiconductor FET devices according to an embodiment of the present disclosure.
Figure 27:
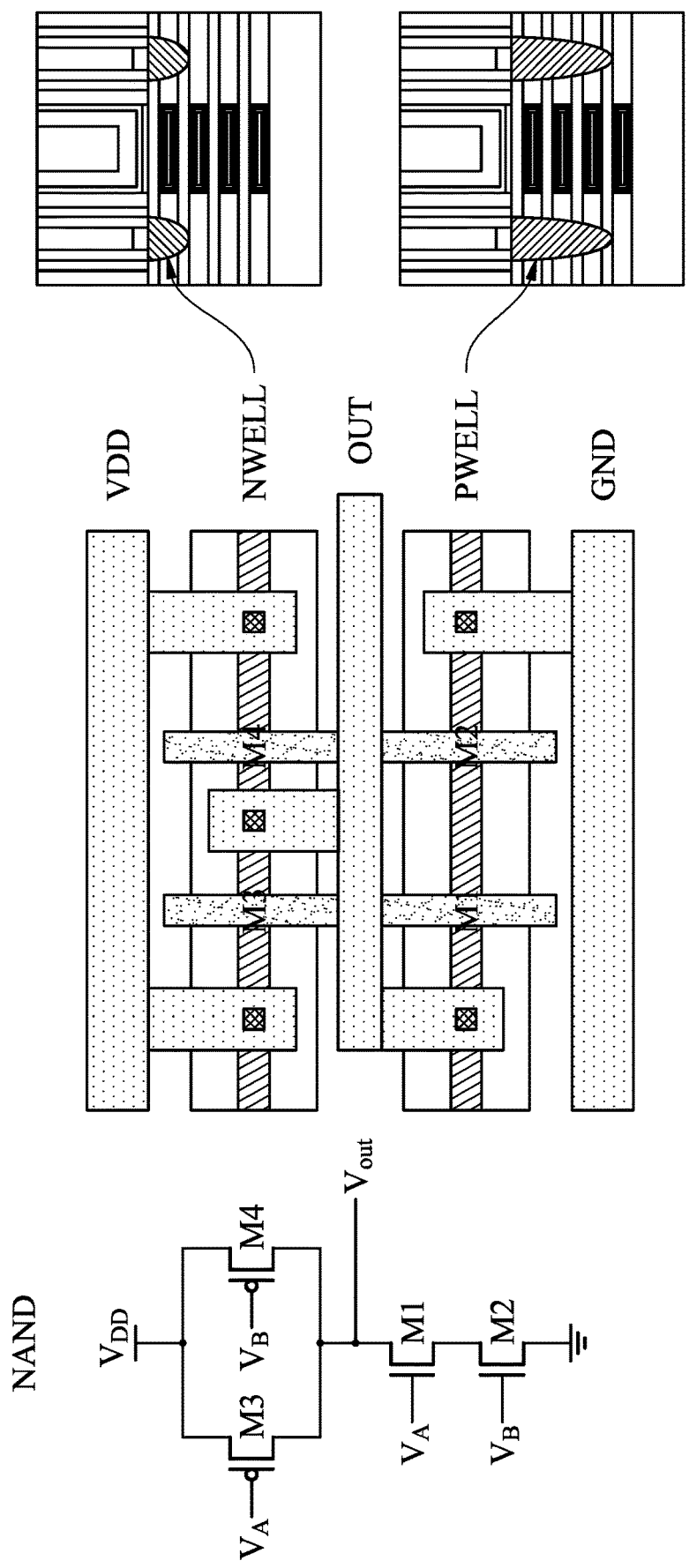
FIG. 27 shows a NAND circuit using semiconductor FET devices according to an embodiment of the present disclosure.

FIGS. 26 and 27 show applications of the GAA FETs with different driving current capacity. Material, configuration, dimensions and/or processes the same as or similar to the foregoing embodiments described with respect to FIGS. 1-25 may be employed in the embodiment of FIGS. 26 and 27, and detailed explanation thereof may be omitted.

FIG. 26 shows a NOR circuit and FIG. 27 shows a NAND circuit. In the NOR circuit shown in FIG. 26, transistors M3 and M4 (e.g., p-type transistors) are connected in series, while transistors M1 and M2 (e.g., n-type transistors) are connected in parallel, between Vdd and Vss (ground). Thus, the transistors M3 and M4 require larger current capacity than the transistors M1 and M2. For this reasons, in some embodiments, the transistor M3 and M4 employ GAA FETs with four semiconductor wires being connected to the source/drain epitaxial layer, while the transistor M1 and M2 employ GAA FETs with two semiconductor wires connected to the source/drain epitaxial layer. The number of semiconductor wires connected to the source/drain epitaxial layer can be adjusted based on device requirements.

In contrast, in the NAND circuit shown in FIG. 27, transistors M3 and M4 (e.g., p-type transistors) are connected in parallel, while transistors M1 and M2 (e.g., n-type transistors) are connected in series, between Vdd and Vss (ground). Thus, the transistors M1 and M2 require larger current capacity than the transistors M3 and M4. For this reason, in some embodiments, the transistors M1 and M2 employ GAA FETs with four semiconductor wires being connected to the source/drain epitaxial layer, while the transistors M3 and M4 employ GAA FETs with two semiconductor wires being connected to the source/drain epitaxial layer. The number of semiconductor wires connected to the source/drain epitaxial layer can be adjusted based on device requirements.

As shown in FIGS. 26 and 27, in the present disclosure, the driving current capacity of a GAA FET can easily be adjusted by adjusting the number of semiconductor wires connected to the source/drain epitaxial layer, which can be achieved by adjusting an etching depth of the second S/D space.

FIGS. 28A-29B show another application of the GAA FETs with different driving current capacity. Material, configuration, dimensions and/or processes the same as or similar to the foregoing embodiments described with respect to FIGS. 1-27 may be employed in the embodiment of FIGS. 28A and 28B, and detailed explanation thereof may be omitted.

Figure 28A:
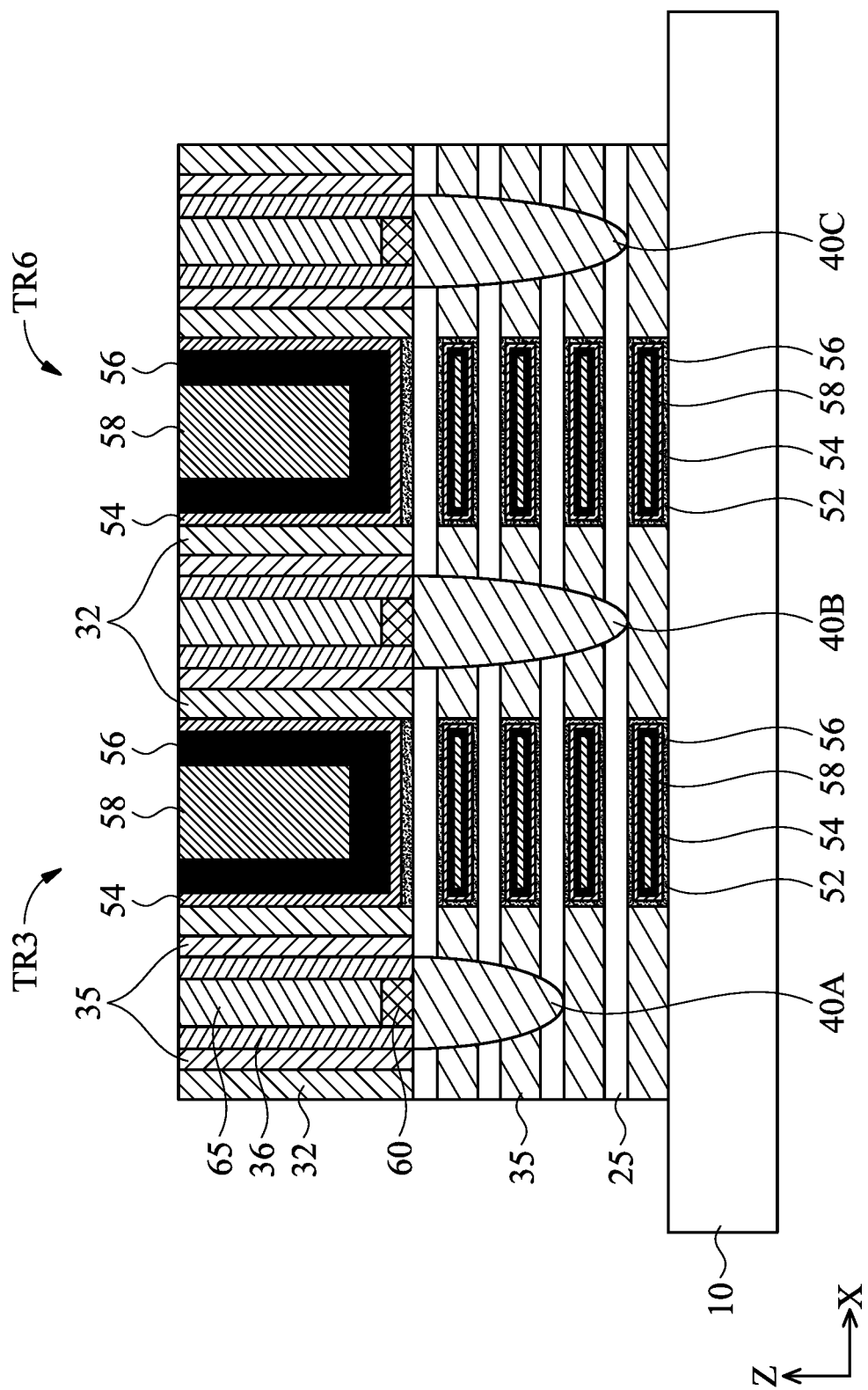
FIG. 28A shows a cross sectional view of a semiconductor FET device and FIG. 28B shows a layout using the semiconductor FET device according to an embodiment of the present disclosure.
Figure 28B:
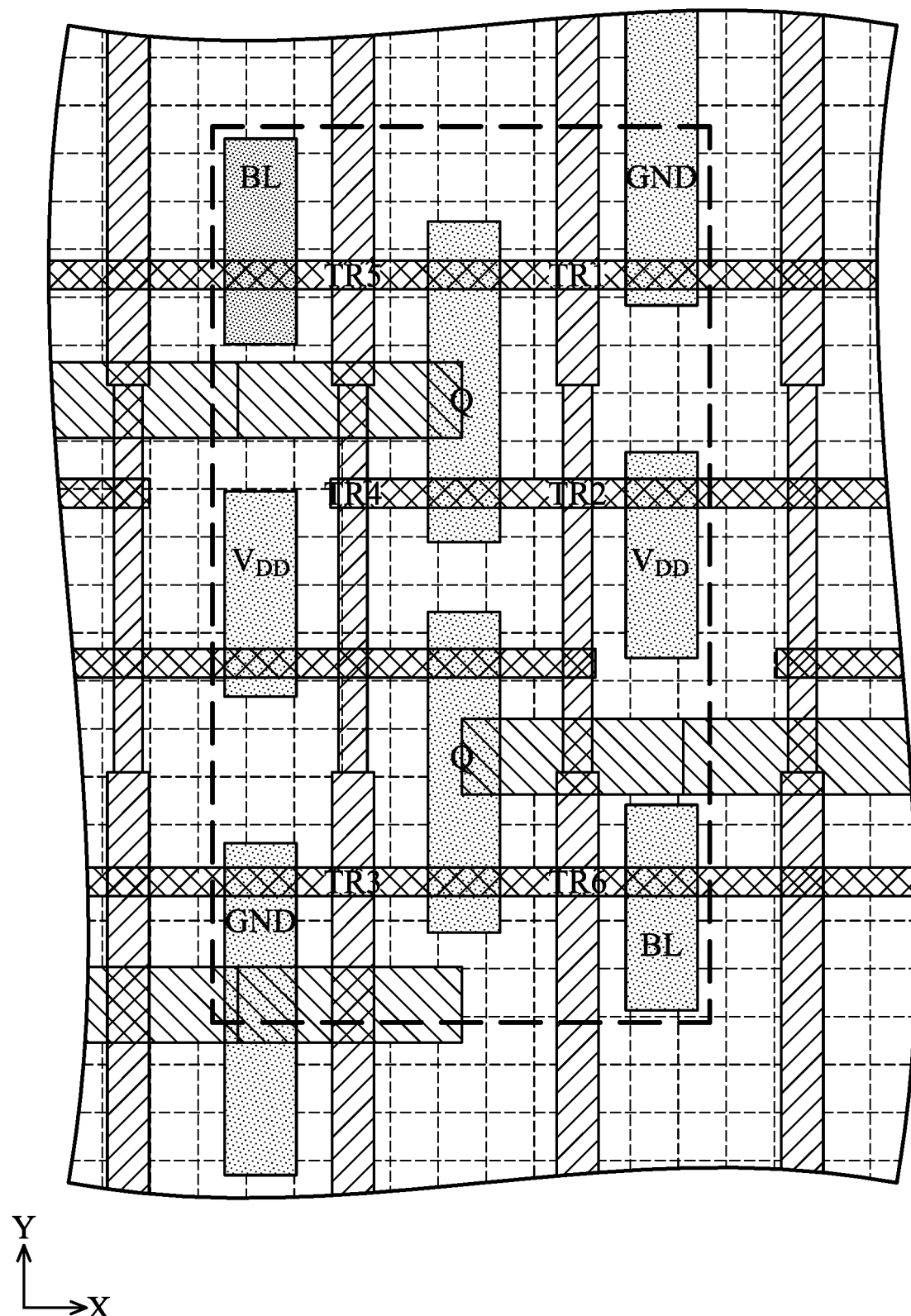
Figure 29A:
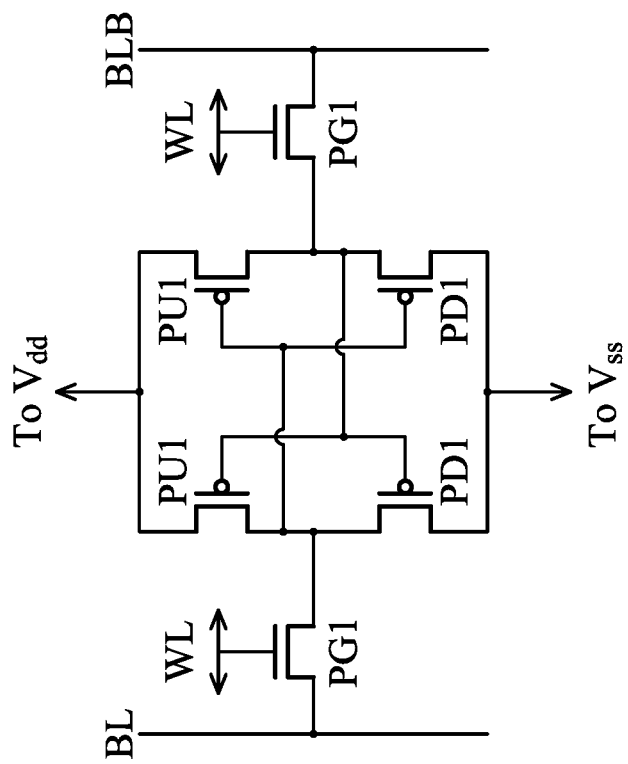

FIG. 28B shows a SRAM unit cell layout corresponding to a circuit diagram shown in FIG. 29A, and FIG. 28A corresponds to the cross section cutting transistors TR3 and TR6 of FIG. 28B.

In FIG. 28A, two GAA FETs TR3 and TR6 share one drain region including a drain epitaxial layer 40B. In the SRAM unit cell, the transistor TR3 is a pull-down transistor and transistor TR6 is a pass-gate transistor, which are both, for example, n-type transistors.

In this embodiment, the numbers of active semiconductor wires 25 (channel regions) of the GAA FET TR3 and that of GAA FET TR6 is different. In some embodiments, the GAA FET TR3 includes three active semiconductor wires 25, while the GAA FET TR6 includes four active semiconductor wires 25. Similar or the same structure is applied to transistors TR1 and TR5, which are another pull-down transistor and pass-gate transistor. As shown in FIG. 28A, source structures are asymmetric with respect to the common drain. The number of active wires of pull-up transistor TR2 and TR4 (p-type transistor) may be the same as or different from that of the pull-down transistors TR1 and TR3 and/or the pass-gate transistors TR5 and TR6.

In a SRAM device, pull-down transistors generally require a driving current capacity equal to or higher than pass-gate transistors and require a driving current capacity higher than pull-up transistors, and the pass-gate transistors generally require a driving current capacity equal to or higher than pull-up transistors. FIGS. 29A and 29B show some configurations of ratios of the driving current capacities for these transistors in a SRAM device. Although FIG. 29B shows various ratios of driving current capacities, it can also be read to show numbers (or ratios in numbers) of active semiconductor wires connected to the source/drain epitaxial layer.

Figure 30:
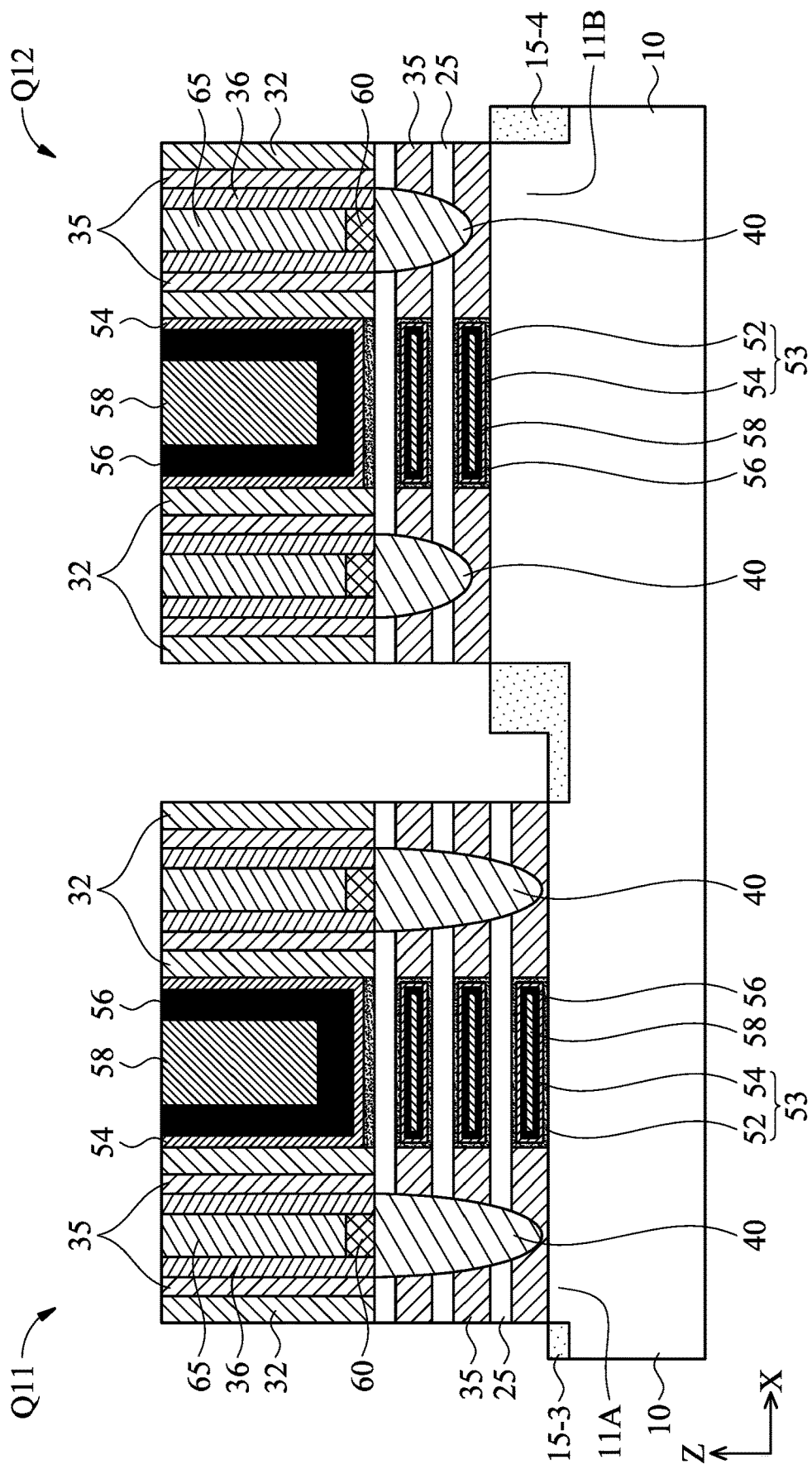
FIG. 30 shows a cross sectional view of a semiconductor FET device according to another embodiment of the present disclosure.

FIG. 30 shows another application of the GAA FETs with different driving current capacity. Material, configuration, dimensions and/or processes the same as or similar to the foregoing embodiments described with respect to FIGS. 1-28B may be employed in the embodiment of FIG. 30, and detailed explanation thereof may be omitted.

In the structure of FIG. 30, the GAA FET Q11 includes four second semiconductor wires 25 disposed above the well layer 11A, while the GAA FET Q12 includes two second semiconductor wires 25 disposed above the well layer 11B. The isolation insulating layer 15-3 for the GAA FET Q11 is thinner than the isolation insulating layer 15-4 for the GA FET Q12. The upper surface of the isolation insulating layer 15-3 is substantially the same as the upper surface of the well layer 11A of the fin structure, and the upper surface of the isolation insulating layer 15-4 is substantially the same as the upper surface of the well layer 11B of the fin structure in some embodiments.

A signal-to-noise margin (Read/Hold) can be improved when the PD/PG ratio in driving capacities is higher and the driving capacity of pull-up transistors is higher. A write margin can be improved when the PG/PU ratio in driving capacities is higher. By adjusting the number of active semiconductor wires connected to the source/drain epitaxial layer, the driving current capacities of GAA FETs in the SRAM cell can be easily adjusted. In addition, reducing the number of active semiconductor wires connected to the source/drain epitaxial layer in a SRAM cell can also reduce an input capacitance and further improve the power and speed of the circuit. By using the GAA FETs with the present embodiments, it is possible to reduce an SRAM cell area by about 6% compared with an SRAM cell using Fin FETs with multiple fins.

The various embodiments or examples described herein offer several advantages over the existing art. For example, in the present disclosure, by adjusting the number of active semiconductor wires connected to the source/drain epitaxial layer, the driving current capacities of GAA FETs and the input capacitance can easily be adjusted. Further, it is possible to minimize the number of fabrication operations and reduce the size of a semiconductor device.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked and protruding from an isolation insulating layer, is formed. A sacrificial gate structure is formed over the fin structure. The first semiconductor layers are etched at a source/drain region of the fin structure, which is not covered by the sacrificial gate structure, thereby forming a first source/drain space in which the second semiconductor layers are exposed. A dielectric layer is formed at the first source/drain space, thereby covering the exposed second semiconductor layers. The dielectric layer and part of the second semiconductor layers are etched, thereby forming a second source/drain space. A source/drain epitaxial layer is formed in the second source/drain space. At least one of the second semiconductor layers is in contact with the source/drain epitaxial layer, and at least one of the second semiconductor layers is separated from the source/drain epitaxial layer disposed thereabove by the dielectric layer. In one or more of the foregoing or following embodiments, the dielectric layer includes a low-k dielectric material. In one or more of the foregoing or following embodiments, after the source/drain epitaxial layer is formed, the sacrificial gate structure is removed, thereby exposing a part of the fin structure, the first semiconductor layers are removed from the exposed fin structure, thereby forming channel layers including the second semiconductor layers, and a gate dielectric layer and a gate electrode layer are formed around the channel layers. In one or more of the foregoing or following embodiments, the gate electrode layer wraps around the at least one of the second semiconductor layers separated from the source/drain epitaxial layer. In one or more of the foregoing or following embodiments, the at least one of the second semiconductor layers separated from the source/drain epitaxial layer is located closer to a substrate than remaining second semiconductor layer contacting the source/drain epitaxial layer. In one or more of the foregoing or following embodiments, two or more of the second semiconductor layers are separated from the source/drain epitaxial layer. In one or more of the foregoing or following embodiments, only one of the second semiconductor layers is in contact with the source/drain epitaxial layer. In one or more of the foregoing or following embodiments, the first semiconductor layers are made of SiGe, and the second semiconductor layers are made of Si.

According to another aspect of the present disclosure, in a method of manufacturing a semiconductor device, a fin structure, in which first semiconductor layers and second semiconductor layers are alternately stacked and protruding from an isolation insulating layer, is formed. A sacrificial gate structure is formed over the fin structure. The first semiconductor layers are etched at a source/drain region of the fin structure, which is not covered by the sacrificial gate structure, thereby forming a first source/drain space in which the second semiconductor layers are exposed. A dielectric layer is formed at the source/drain region, thereby covering the exposed second semiconductor layers. The dielectric layer is etched, thereby forming a second source/drain space, at least one of the second semiconductor layers being exposed in and crossing the second source/drain space. A source/drain epitaxial layer is formed in the second source/drain space. At least one of the second semiconductor layers exposed in the second source/drain space is in contact with the source/drain epitaxial layer, and at least one of the second semiconductor layers is separated from the source/drain epitaxial layer disposed thereabove by the dielectric layer. In one or more of the foregoing or following embodiments, the dielectric layer includes a low-k dielectric material. In one or more of the foregoing or following embodiments, after the source/drain epitaxial layer is formed, the sacrificial gate structure is removed, thereby exposing a part of the fin structure, the first semiconductor layers are removed from the exposed fin structure, thereby forming channel layers including the second semiconductor layers, and a gate dielectric layer and a gate electrode layer are formed around the channel layers. In one or more of the foregoing or following embodiments, the gate electrode layer wraps around the at least one of the second semiconductor layers separated from the source/drain epitaxial layer. In one or more of the foregoing or following embodiments, the at least one of the second semiconductor layers separated from the source/drain epitaxial layer is located closer to a substrate than remaining second semiconductor layer contacting the source/drain epitaxial layer. In one or more of the foregoing or following embodiments, two or more of the second semiconductor layers are separated from the source/drain epitaxial layer. In one or more of the foregoing or following embodiments, only one of the second semiconductor layers is in contact with the source/drain epitaxial layer. In one or more of the foregoing or following embodiments, the first semiconductor layers are made of SiGe, and the second semiconductor layers are made of Si.

In accordance with another aspect of the present application, in a method of manufacturing a semiconductor device, a first fin structure and a second fin structure, in both of which first semiconductor layers and second semiconductor layers are alternately stacked and protruding from an isolation insulating layer, are formed. A first sacrificial gate structure is formed over the first fin structure, and a second sacrificial gate structure is formed over the second fin structure. The first semiconductor layers are removed from a first source/drain region of the first fin structure, which is not covered by the first sacrificial gate structure, and the first semiconductor layers are removed from a second source/drain region of the second fin structure, which is not covered by the second sacrificial gate structure. A first insulating layer is formed around the second semiconductor layers in the first and second source/drain regions. The dielectric layer and part of the second semiconductor layers are etched at the first source/drain region, thereby forming a first source/drain space. The dielectric layer and part of the second semiconductor layers are etched at the second source/drain region, thereby forming a second source/drain space. A first source/drain epitaxial layer is formed in the first source/drain space, and a second source/drain epitaxial layer is formed in the second source/drain space. A number of the second semiconductor layers contacting the first source/drain epitaxial layer in the first source/drain region is different from a number of the second semiconductor layers contacting the second source/drain epitaxial layer in the second source/drain region. A thickness of the isolation insulating layer surrounding the first fin structure is different from a thickness of an isolation insulating layer surrounding the second fin structure. In one or more of the foregoing or following embodiments, the dielectric layer includes a low-k dielectric material. In one or more of the foregoing or following embodiments, the first semiconductor layers are made of SiGe, and the second semiconductor layers are made of Si. In one or more of the foregoing or following embodiments, a total number of the second semiconductor layers in the first fin structure is equal to a total number of the second semiconductor layers in the first fin structure, and the total number of the second semiconductor layers is in a range from 3 to 15.

In accordance with another aspect of the present disclosure, in a method of manufacturing a semiconductor device, a fin structure, in which first semiconductor layers and second semiconductor layers are alternately stacked, is formed. A sacrificial gate structure is formed over the fin structure. The first semiconductor layers are etched at a source region and a drain region of the fin structure, which are not covered by the sacrificial gate structure, thereby forming a first source space and a first drain space, in both of which the second semiconductor layers are exposed. A dielectric layer is formed at the first source space and the first drain space, thereby covering the exposed second semiconductor layers. The dielectric layer and part of the second semiconductor layers are etched, thereby forming a second source space and a second drain space. A source epitaxial layer is formed in the second source space and a drain epitaxial layer is formed in the second drain space. A number of the second semiconductor layers contacting the source epitaxial layer in the source region is different from a number of the second semiconductor layers contacting the drain epitaxial layer in the drain region.

In accordance with one aspect of the present disclosure, a semiconductor device includes a first gate-all-around field effect transistor (GAA FET) disposed over a substrate, and a second GAA FET disposed over the substrate. Each of the first GAA FET and the second GAA FET includes semiconductor wires vertically arranged over the substrate, a source/drain epitaxial layer in contact with one or more of the semiconductor wires, a gate dielectric layer disposed on and wrapping around each channel region of the semiconductor wires, and a gate electrode layer disposed on the gate dielectric layer and wrapping around the each channel region. In at least one of the first GAA FET and the second GAA FET, at least one of the semiconductor wires is separated from the source/drain epitaxial layer disposed thereabove by a dielectric layer. A thickness of an isolation insulating layer surrounding the first GAA FET is different from a thickness of an isolation insulating layer surrounding the second GAA FET. In one or more of the foregoing or following embodiments, a number of the semiconductor wires contacting the source/drain epitaxial layer in the first GAA FET is different from a number of the semiconductor wires contacting the source/drain epitaxial layer in the second GAA FET. The thickness of an isolation insulating layer surrounding the first GAA FET is smaller than the thickness of an isolation insulating layer surrounding the second GAA FET. In one or more of the foregoing or following embodiments, the dielectric layer includes a low-k dielectric material. In one or more of the foregoing or following embodiments, the number of the semiconductor wires contacting the source/drain epitaxial layer in the first GAA FET is greater than the number of the semiconductor wires contacting the source/drain epitaxial layer in the second GAA FET, and in the second GAA FET, at least one of the semiconductor wires is separated from the source/drain epitaxial layer disposed thereabove by a dielectric layer. In one or more of the foregoing or following embodiments, the gate electrode layer wraps around the at least one of the semiconductor wires separated from the source/drain epitaxial layer in the second GAA FET. In one or more of the foregoing or following embodiments, the at least one of the semiconductor wires separated from the source/drain epitaxial layer is located closer to the substrate than remaining one or more semiconductor wires contacting the source/drain epitaxial layer. In one or more of the foregoing or following embodiments, in the second GAA FET, two or more of the semiconductor wires are separated from the source/drain epitaxial layer. In one or more of the foregoing or following embodiments, in the second GAA FET, only one of the semiconductor wires is in contact with the source/drain epitaxial layer. In one or more of the foregoing or following embodiments, in the first GAA FET, at least one of the semiconductor wires is separated from the source/drain epitaxial layer disposed thereabove by the dielectric layer. In one or more of the foregoing or following embodiments, in the first GAA FET, all of the semiconductor wires are in contact with the source/drain epitaxial layer. In one or more of the foregoing or following embodiments, a number of the semiconductor wires contacting the source/drain epitaxial layer in the first GAA FET is equal to a number of the semiconductor wires contacting the source/drain epitaxial layer in the second GAA FET.

In accordance with another aspect of the present disclosure, a semiconductor device includes semiconductor wires vertically arranged over a substrate, a source/drain epitaxial layer in contact with one or more of the semiconductor wires, a gate dielectric layer disposed on and wrapping around each channel region of the semiconductor wires, and a gate electrode layer disposed on the gate dielectric layer and wrapping around the each channel region. At least one of the semiconductor wires is separated from the source/drain epitaxial layer disposed thereabove by a dielectric layer. In one or more of the foregoing or following embodiments, the gate electrode layer wraps around the at least one of the second semiconductor wires separated from the source/drain epitaxial layer in the second GAA FET. In one or more of the foregoing or following embodiments, two or more of the semiconductor wires are separated from the source/drain epitaxial layer by the dielectric layer.

In accordance with another aspect of the present disclosure, a semiconductor device includes a gate-all-around field effect transistor (GAA FET). The GAA FET includes semiconductor wires vertically arranged over a substrate, a source epitaxial layer in contact with one or more of the semiconductor wires, a drain epitaxial layer in contact with one or more of the semiconductor wires, a gate dielectric layer disposed on and wrapping around each channel region of the semiconductor wires, and a gate electrode layer disposed on the gate dielectric layer and wrapping around the each channel region. A number of the semiconductor wires contacting the source epitaxial layer is different from a number of the semiconductor wires contacting the drain epitaxial layer. In one or more of the foregoing or following embodiments, at least one of the semiconductor wires is separated from at least one of the source and drain epitaxial layers by a dielectric layer. In one or more of the foregoing or following embodiments, the gate electrode layer wraps around the at least one of the semiconductor wires separated from the at least one of the source and drain epitaxial layers. In one or more of the foregoing or following embodiments, all of the semiconductor wires are in contact with the source epitaxial layer. In one or more of the foregoing or following embodiments, at least one of the semiconductor wires is separated from the source epitaxial layer by a dielectric layer, and two or more of the semiconductor wires are separated from the source epitaxial layer. In one or more of the foregoing or following embodiments, only one of the semiconductor wires is in contact with the source epitaxial layer.

In accordance with another aspect of the present disclosure, a semiconductor device includes semiconductor wires vertically arranged over a substrate, a source/drain epitaxial layer wrapping around each source/drain region of one or more of the semiconductor wires, a gate dielectric layer disposed on and wrapping around each channel region of the semiconductor wires, and a gate electrode layer disposed on the gate dielectric layer and wrapping around the each channel region. At least one of the semiconductor wires is separated from the source/drain epitaxial layer disposed thereabove by a dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first gate-all-around field effect transistor (GAA FET) disposed over a substrate; and
    a second GAA FET disposed over the substrate, wherein:
    each of the first GAA FET and the second GAA FET includes:
        semiconductor wires vertically arranged over the substrate;
        a source/drain epitaxial layer in contact with one or more of the semiconductor wires;
        a gate dielectric layer disposed on and wrapping around each channel region of the semiconductor wires; and
        a gate electrode layer disposed on the gate dielectric layer and wrapping around the each channel region,
    in at least one of the first GAA FET and the second GAA FET, at least one of the semiconductor wires is separated from a bottom of the source/drain epitaxial layer by a dielectric layer, and
    a thickness of an isolation insulating layer surrounding the first GAA FET is different from a thickness of an isolation insulating layer surrounding the second GAA FET.

2. The semiconductor device of claim 1, wherein a number of the semiconductor wires contacting the source/drain epitaxial layer in the first GAA FET is different from a number of the semiconductor wires contacting the source/drain epitaxial layer in the second GAA FET.

3. The semiconductor device of claim 2, wherein the dielectric layer includes a low-k dielectric material.

4. The semiconductor device of claim 2, wherein:
    the number of the semiconductor wires contacting the source/drain epitaxial layer in the first GAA FET is greater than the number of the semiconductor wires contacting the source/drain epitaxial layer in the second GAA FET, and
    in the second GAA FET, at least one of the semiconductor wires is separated from the bottom of the source/drain epitaxial layer by the dielectric layer.

5. The semiconductor device of claim 4, wherein the gate electrode layer wraps the at least one of the semiconductor wires separated from the bottom of the source/drain epitaxial layer in the second GAA FET.

6. The semiconductor device of claim 4, wherein the at least one of the semiconductor wires separated from the bottom of the source/drain epitaxial layer is located closer to the substrate than remaining one or more semiconductor wires contacting the source/drain epitaxial layer.

7. The semiconductor device of claim 4, wherein in the second GAA FET, two or more of the semiconductor wires are electrically separated from the bottom of the source/drain epitaxial layer.

8. The semiconductor device of claim 4, wherein, in the second GAA FET, only one of the semiconductor wires is in contact with the source/drain epitaxial layer.

9. The semiconductor device of claim 4, wherein, in the first GAA FET, at least one of the semiconductor wires is separated from the bottom of the source/drain epitaxial layer by the dielectric layer.

10. The semiconductor device of claim 4, wherein, in the first GAA FET, all of the semiconductor wires are in contact with the source/drain epitaxial layer.

11. The semiconductor device of claim 1, wherein a number of the semiconductor wires contacting the source/drain epitaxial layer in the first GAA FET is equal to a number of the semiconductor wires contacting the source/drain epitaxial layer in the second GAA FET.

12. A semiconductor device, comprising:
    semiconductor wires vertically arranged over a substrate;
    a source/drain epitaxial layer in contact with one or more of the semiconductor wires;
    a gate dielectric layer disposed on and wrapping around each channel region of the semiconductor wires;
    a gate electrode layer disposed on the gate dielectric layer and wrapping around the each channel region;
    a dielectric layer disposed in a source/drain region; and
    an isolation insulating layer, wherein:
    at least one of the semiconductor wires is separated from a bottom of the source/drain epitaxial layer by the dielectric layer, and an upper surface of the isolation insulating layer is located at a level below the bottom of the source/drain epitaxial layer.

13. The semiconductor device of claim 12, wherein the gate electrode layer wraps the at least one of the semiconductor wires separated from the bottom of the source/drain epitaxial layer.

14. The semiconductor device of claim 13, wherein two or more of the semiconductor wires are separated from the bottom of the source/drain epitaxial layer by the dielectric layer.

15. The semiconductor device of claim 12, wherein the dielectric layer includes a low-k dielectric material.

16. The semiconductor device of claim 12, wherein the bottom of the source/drain epitaxial layer is in contact with the dielectric layer.

17. The semiconductor device of claim 12, wherein the bottom of the source/drain epitaxial layer is in contact with one of the semiconductor wires.

18. A semiconductor device, comprising:
a first gate-all-around field effect transistor (GAA FET) disposed over a substrate; and
a second GAA FET disposed over the substrate, wherein:
each of the first GAA FET and the second GAA FET includes:
semiconductor wires vertically arranged over the substrate;
a source/drain epitaxial layer wrapping around each source/drain region of one or more of the semiconductor wires;
a gate dielectric layer disposed on and wrapping around each channel region of the semiconductor wires; and
a gate electrode layer disposed on the gate dielectric layer and wrapping around the each channel region,
in at least one of the first GAA FET and the second GAA FET, at least one of the semiconductor wires is separated from a bottom of the source/drain epitaxial layer by a dielectric layer, and
a thickness of an isolation insulating layer surrounding the first GAA FET is different from a thickness of an isolation insulating layer surrounding the second GAA FET.

19. The semiconductor device of claim 18, wherein a number of the semiconductor wires contacting the source/drain epitaxial layer in the first GAA FET is different from a number of the semiconductor wires contacting the source/drain epitaxial layer in the second GAA FET.

20. The semiconductor device of claim 18, wherein:
the number of the semiconductor wires contacting the source/drain epitaxial layer in the first GAA FET is greater than the number of the semiconductor wires contacting the source/drain epitaxial layer in the second GAA FET, and
in the second GAA FET, at least one of the semiconductor wires is separated from the bottom of the source/drain epitaxial layer by the dielectric layer.

* * * * *